US012603136B2

(12) United States Patent
Ezzadeen et al.

(10) Patent No.: US 12,603,136 B2
(45) Date of Patent: Apr. 14, 2026

(54) THREE-DIMENSIONAL NOR MEMORY STRUCTURE WITH RESISTIVE MEMORY CELLS

(71) Applicants:COMMISSARIAT A L'ENERGIE ATOMIQUE ET AUX ENERGIES ALTERNATIVES, Paris (FR); Centre national de la recherche scientifique, Paris (FR); UNIVERSITE D'AIX-MARSEILLE, Marseilles (FR)

(72) Inventors: Mona Ezzadeen, Grenoble (FR); François Andrieu, Grenoble (FR); Jean-Michel Portal, Saint Savournin (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR); UNIVERSITE D'AIX-MARSEILLE, Marseilles (FR)

( * ) Notice: Subject to any disclaimer, the term of this patent is extended or adjusted under 35 U.S.C. 154(b) by 156 days.

(21) Appl. No.: 18/388,164

(22) Filed: Nov. 8, 2023

(65) Prior Publication Data
US 2024/0153566 A1 May 9, 2024

(30) Foreign Application Priority Data
Nov. 9, 2022 (FR) ........................................ 2211695

(51) Int. Cl.
*G11C 16/26* (2006.01)
*G11C 16/10* (2006.01)
(Continued)

(52) U.S. Cl.
CPC .............. *G11C 16/26* (2013.01); *G11C 16/10* (2013.01); *H01L 23/5226* (2013.01);
(Continued)

(58) Field of Classification Search
CPC ..... G11C 16/26; G11C 16/10; G11C 16/0483; H01L 23/5226; H01L 23/5283;
(Continued)

(56) References Cited

U.S. PATENT DOCUMENTS 9,711,229 B1 7/2017 Rabkin et al.
2017/0062384 A1* 3/2017 Lee ..................... H01L 23/5386
(Continued)

*Primary Examiner* — Jerome Leboeuf
(74) *Attorney, Agent, or Firm* — Baker Hostetler

(57) ABSTRACT

A data storage circuit of NOR type includes a three-dimensional memory structure, produced on a first semiconductor substrate, and comprising a plurality of memory planes, each plane forming a two-dimensional array of memory cells. Each memory cell has a selection node, a first input/output node and a second input/output node. The three-dimensional memory structure has an upper surface comprising a plurality of connectors distributed over the surface; each connector is connected to at least one among the first or second input/output nodes of a given column; a control circuit produced on a second semiconductor substrate; an interconnection structure comprising: a plurality of bonding pads placed between the control circuit and the upper surface; the plurality of bonding pads forms a periodic repetition of a unit pattern in a plane parallel to the upper surface.

12 Claims, 16 Drawing Sheets

(51) Int. Cl.

| | |
|---|---|
| *H01L 23/522* | (2006.01) |
| *H01L 23/528* | (2006.01) |
| *H10B 41/10* | (2023.01) |
| *H10B 41/27* | (2023.01) |
| *H10B 41/35* | (2023.01) |
| *H10B 41/41* | (2023.01) |
| *H10B 43/10* | (2023.01) |
| *H10B 43/27* | (2023.01) |
| *H10B 43/35* | (2023.01) |
| *H10B 43/40* | (2023.01) |

(52) U.S. Cl.

CPC ......... *H01L 23/5283* (2013.01); *H10B 41/10* (2023.02); *H10B 41/27* (2023.02); *H10B 41/35* (2023.02); *H10B 41/41* (2023.02); *H10B 43/10* (2023.02); *H10B 43/27* (2023.02); *H10B 43/35* (2023.02); *H10B 43/40* (2023.02)

(58) Field of Classification Search

CPC ........ H10B 41/10; H10B 41/27; H10B 41/35; H10B 41/41; H10B 43/10; H10B 43/27; H10B 43/35; H10B 43/40; H10B 63/845; H10B 63/84; H10N 70/20

See application file for complete search history.

(56) References Cited

U.S. PATENT DOCUMENTS

| | | | |
|---|---|---|---|
| 2019/0006386 A1 | 1/2019 | Yamazaki et al. | |
| 2020/0411097 A1 | 12/2020 | Nam et al. | |
| 2022/0157845 A1 | 5/2022 | Lee et al. | |
| 2023/0005862 A1* | 1/2023 | Wang ..................... | H01L 25/50 |
| 2023/0337442 A1* | 10/2023 | Zhu ........................ | H10B 43/27 |
| 2024/0074213 A1* | 2/2024 | Iwasaki ................. | H10B 43/27 |
| 2024/0357838 A1* | 10/2024 | Wu ..................... | H10B 63/845 |

* cited by examiner

THREE-DIMENSIONAL NOR MEMORY STRUCTURE WITH RESISTIVE MEMORY CELLS

CROSS-REFERENCE TO RELATED APPLICATION

This application claims priority to foreign French patent application No. FR 2211695, filed on Nov. 9, 2022, the disclosure of which is incorporated by reference in its entirety.

FIELD OF THE INVENTION

The present invention relates to the field of integration of data storage circuits based on three-dimensional memory structures. More particularly, the invention relates to an optimal connection configuration for a three-dimensional memory structure based on resistive non-volatile memories with its peripheral circuitry produced on a different semiconductor substrate.

BACKGROUND

Emerging non-volatile memory technologies allow memory circuits to be produced that are denser and more compact than conventional planar structures. However, current three-dimensional storage circuit solutions face a major constraint: it is difficult to access each memory cell of the structure individually to carry out read and/or write operations. This connectivity constraint means that it is necessary to employ sequential operation. This type of operation increases the time required to carry out read and/or write operations and thus reduces the performance of the storage circuit.

The "NOR" architecture is a promising candidate for increasing access parallelism and thus increasing the performance of 3D storage circuits. Specifically, in a "NOR" memory architecture, all the memory cells are read and write accessible independently and individually without inhibition or prior selection of adjacent memory cells being required. This increases programming flexibility and considerably improves execution time. However, implementation of a NOR architecture in a three-dimensional memory structure on a single substrate faces at least the following technical constraints:

the need to use large circuits peripheral to the memories. These peripheral circuits cover, by way of example, a plurality of detection amplifiers and read and write control circuits. This considerably increases the footprint of the circuit and the physical complexity of implementation;

the need to use a plurality of metallization levels to achieve the complex interconnections between the memory cells and peripheral circuits. The severity of this constraint increases with size of the three-dimensional memory structure; and the low performance of the memory cells used in the three-dimensional memory structures with respect to transistors at advanced technological nodes.

Thus, there is a need to conceive new 3D storage circuit architectures that are less complex, denser and that increase read/write access flexibility while improving performance in terms of execution speed.

Known two-dimensional (planar) NOR flash memory solutions have a structure that allows parallelization of write and read operations. The drawback of this type of structure is that parallelization is achieved at the expense of the spatial density of the structure. This limits the number of memory cells in a predetermined area.

The structure of known three-dimensional (cubic) NAND solutions has a better spatial density. The drawback of this type of structure is that the parallelization of read/write operations is very limited. Sequential access is necessary because electrical access to the input/output nodes is shared between the memory cells, which are mounted in series in this type of structure.

Answer to the Problem and Solution Provided

To overcome the limitations of existing solutions from a density and operation parallelism point of view, the invention provides a circuit based on a three-dimensional memory structure produced on a first semiconductor substrate and connected vertically to peripheral circuits produced on a second semiconductor substrate. The second semiconductor substrate is superposed on the three-dimensional memory structure. The peripheral circuits and memory cells of the 3D memory structure are connected by way of vertical connections (taking the form of vias) and a distribution of bonding pads confined between the 3D structure and the second semiconductor substrate.

The device according to the invention has an optimal connection-pad distribution allowing the 3D memory structure to be divided into a plurality of sub-arrays of independent memory cells. This makes it possible to obtain a "NOR" structure and to improve the parallelism of memory-cell read and write operations. The invention thus allows an innovative division into blocks and routing such as to obtain NOR-type access. This allows a fine granularity to be obtained in the three-dimensional structure, enabling high read and write parallelization.

In addition, the device according to the invention is realizable with a number of memory cells considerably greater than that of known non-volatile NOR memory solutions (2D NOR flash memory solutions for example). This has the advantage of increasing storage capacities. Thus, the device is capable of parallelizing a considerable number of data processing operations to obtain better performance.

The device according to the invention further allows the complexity of the peripheral circuits to be reduced through use of transistors at advanced technological nodes, which occupy less real estate and have an improved performance. By way of example, the expression "transistors at advanced technological nodes" covers transistors at a technological node below 28 nm.

SUMMARY OF THE INVENTION

The subject of the invention is a data storage circuit of NOR type comprising:

a three-dimensional memory structure, produced on a first semiconductor substrate, and comprising a plurality of memory planes of rank i ranging from 1 to N, with N a natural number greater than 1, each plane forming a two-dimensional array of non-volatile, resistive and programmable memory cells. Each memory cell has a selection node, a first input/output node and a second input/output node. Said array comprises M rows of rank j ranging from 1 to M and K columns of rank k ranging from 1 to K, with M and K two non-zero natural numbers.

For each memory plane: the first input/output nodes of the memory cells belonging to a given column are interconnected; and the second input/output nodes of the memory cells belonging to a given column are interconnected. The three-dimensional memory structure has an upper surface comprising a plurality of connectors distributed over said surface; each connector is connected to at least one among the first or second input/output nodes of a given column;

a control circuit configured to apply control voltages to the nodes of each memory cell; and produced on a second semiconductor substrate; the control circuit is superposed on said upper surface;

an interconnection structure comprising:

a plurality of bonding pads placed between the control circuit and said upper surface; each bonding pad connects the control circuit to a dedicated connector; each bonding pad is connected to an elementary group of memory cells belonging to separate memory planes. Said plurality of bonding pads forms a periodic repetition of a unit pattern in a plane parallel to the upper surface.

According to one particular aspect of the invention, each bonding pad has a first dimension in a first direction and a second dimension in a second direction. The width in the first direction of the unit pattern in the first direction is equal to said first dimension multiplied by $4*nb_x$, with $nb_x$ the number of connectors covered by the area of the bonding pad belonging to a given memory plane in the second direction. The length is equal to twice the second dimension of said bonding pad in the second direction.

According to one particular aspect of the invention, the interconnection structure further comprises for each elementary group:

a first connection track for interconnecting the first input/output nodes of the memory cells belonging to columns of given rank k of a plurality of separate memory planes;

a second connection track for interconnecting the second input/output nodes of the memory cells belonging to columns of given rank k of a plurality of separate memory planes.

According to one particular aspect of the invention, the data storage circuit further comprises a dielectric layer encapsulating the three-dimensional memory structure and bearing the plurality of bonding pads.

According to one particular aspect of the invention, the interconnection structure further comprises a set of through-vias passing through the dielectric layer. Each via among the set of vias is intended to connect one bonding pad to one associated connector.

According to one particular aspect of the invention, the data storage circuit further comprises at least one read circuit produced on the second semiconductor substrate.

According to one particular aspect of the invention, each read circuit comprises an inverter able to carry out a differential read of two memory cells belonging to two adjacent columns and having a common first input/output node and having two second input/output nodes intended to receive complementary control signals.

According to one particular aspect of the invention, each memory cell comprises:

a programmable resistive storage structure having:

an upper electrode connected to the second input/output node of said memory cell;

and a lower electrode;

a selection transistor having a gate connected to the selection node of said memory cell and connecting the lower electrode to the first input/output node of said memory cell.

According to one particular aspect of the invention, each column of memory cells comprises:

a stack of a plurality of selection transistors in a first direction;

each selection transistor being of gate-all-around type and comprising, perpendicular to the first direction, a conduction channel made of a semiconductor and having two ends;

the first end of the channel corresponding to the source of the selection transistor and the second corresponding to the drain of the transistor;

in the first direction, a first metal pillar connecting the sources of the various selection transistors;

a second dielectric layer parallel to the first direction and laterally covering the drains of the selection transistors;

at least one metal layer parallel to the first direction and deposited on the dielectric layer;

in the first direction, a second metal pillar making lateral contact with the at least one metal layer;

for each selection transistor, the assembly formed by the source, the dielectric layer and the metal layer forms an elementary resistive storage structure.

According to one particular aspect of the invention, the area of a bonding pad is equal to the area of a region of the upper surface comprising a single connector. The unit pattern comprises three bonding pads. The unit pattern covers an elementary group of memory cells belonging to six separate successive memory planes.

According to one particular aspect of the invention, the area of a bonding pad is equal to the area of a region of the upper surface comprising at least six connectors. The unit pattern comprises at least six bonding pads. The unit pattern covers an elementary group of memory cells belonging to at least 96 separate successive memory planes.

According to one particular aspect of the invention, the unit pattern comprises a first sub-group of bonding pads and a second sub-group of bonding pads, the sub-groups being symmetrical with respect to each other about a central point of the unit pattern.

According to one particular aspect of the invention, the unit pattern covers two groups of an equal number of one or more columns, each group of one or more columns being connected to the same number of bonding pads.

BRIEF DESCRIPTION OF THE DRAWINGS

Other features and advantages of the present invention will become more clearly apparent on reading the following description with reference to the following appended drawings.

DETAILED DESCRIPTION

Figure 1A:
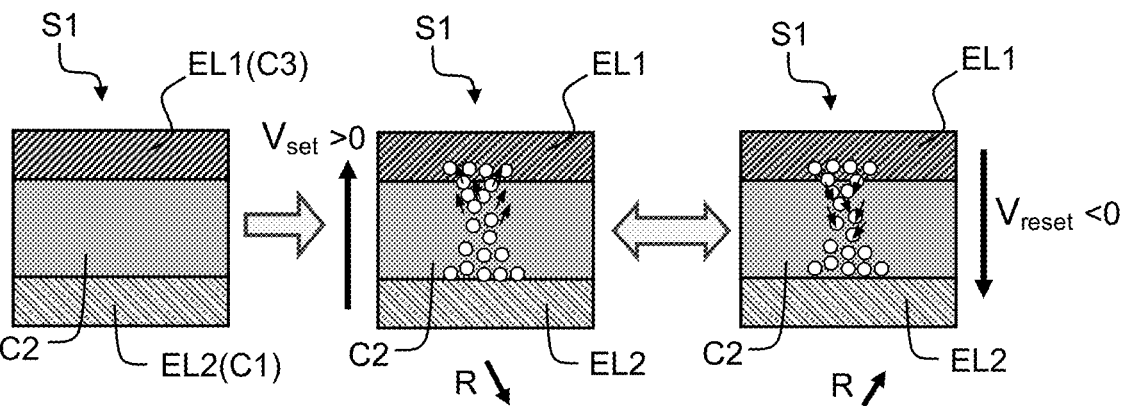
FIG. 1a illustrates a cross-sectional view of an elementary programmable resistive storage structure.

To start with the operating principle of an elementary programmable resistive storage structure will be described. FIG. 1a illustrates a cross-sectional view of an elementary programmable resistive storage structure. The elementary storage structure S1 is composed of a stack of thin layers in the following order: at least one first layer C1 made of an electrically conductive material forming a lower electrode EL2; a second layer C2 made of a dielectric material and at least one third layer C3 made of electrically conductive material forming an upper electrode EL1. The characteristics of the materials from which the structural layers of the elementary memory S1 are made allow a type of resistive memory operation based on variable conductive filaments to be obtained. The second layer C2 is denoted the "central layer" in the remainder of the description.

Alternatively, it is possible to produce each electrode EL1 and/or EL2 using a stack of a plurality of conductive layers.

By way of example and without loss of generality, the first layer C1 (and therefore the lower electrode EL2) and the third layer C3 (and therefore the upper electrode EL1) are made of titanium nitride TiN. The thickness of each of the layers C1 (EL2) and C3 (EL1) is of the order of a few tens of nanometres, and more particularly equal to 100 nm.

By way of example and without loss of generality, the central layer C2 is made of hafnium oxide. The thickness of the central layer C2 is of the order of a few nanometres, and more particularly equal to 10 nm.

Operation of a resistive elementary storage structure S1 requires a conductive filament F to form through at least part of the central layer C2, which is electrically insulating.

Initially, the elementary storage structure S1 is a MIM (metal-insulator-metal) structure having infinite resistance between the two electrodes EL1 and EL2. First, the filament F must be formed through at least part of the volume of the central layer C2. Formation of the filament allows a variable resistance to be obtained through modulation of the length I of the conductive filament that is formed. To form the filament, a positive formation voltage is applied to the upper electrode EL1. The formation voltage has an amplitude and/or a duration great enough to bring about the generation of oxygen vacancies in the central layer C2. Specifically, the applied electrical formation voltage must exceed a predetermined value so as to tear oxygen ions from the crystal lattice of the metal-oxide central layer. The ions will merge towards the upper electrode EL2 to form, through the central layer, a conductive filament F made up of oxygen vacancies.

Once the conductive filament F has been formed, the resistive element exhibits a variable resistance R that depends on the length of the conductive filament F. When the electric potential of the upper electrode $V_{EL1}$ is lower than that of the lower electrode $V_{EL2}$, the elementary storage structure S1 sees a negative voltage $V_{reset}$ across its terminals. In this case, oxygen ions will fill some of the oxygen vacancies forming the conductive filament. This results in a decrease in the length of the conductive filament. Thus, the resistance of the resistive element increases. A resistive state that is said to be high and a write operation that is said to be of RESET type are obtained. Conversely, when the electric potential of the upper electrode $V_{EL1}$ is higher than that of the lower electrode $V_{EL2}$, the elementary storage structure S1 sees a positive voltage $V_{set}$ across its terminals. The length of the conductive filament F increases via the same mechanism described with regard to the filament-forming operation. Thus, the resistance of the resistive element decreases. A resistive state that is said to be low and a write operation that is said to be of SET type are obtained.

The applied voltage $V_{set}$ must be higher in absolute value than a first voltage threshold to pass from a high resistive state to a low resistive state. Likewise, the applied voltage $V_{reset}$ must be higher in absolute value than a second voltage threshold to pass from a low resistive state to a high resistive state.

The following convention is chosen by way of example: when the elementary storage structure S1 is configured to store a binary datum in the high logic state (x=1) it is in a low resistive state. Conversely, when the elementary storage structure S1 is configured to store a binary datum in the low logic state (x=0) it is in a high resistive state. The inverse convention is also possible.

Figure 1B:
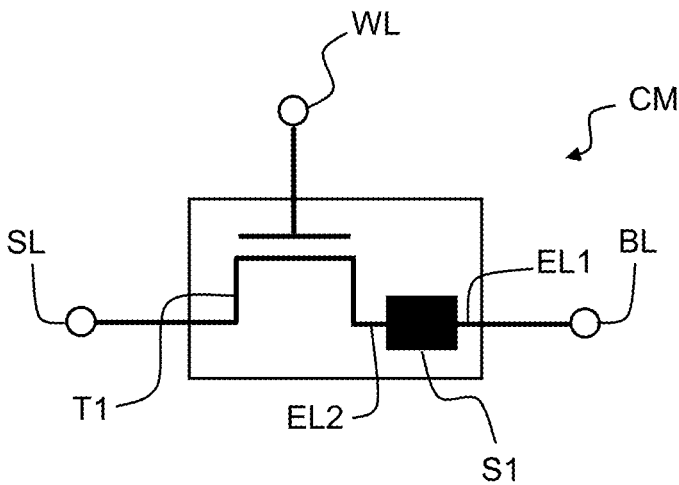
FIG. 1b illustrates a memory cell used in production of the storage circuit according to the invention.

FIG. 1b illustrates an electrical schematic of a memory cell CM according to the invention. The memory cell CM comprises a memory structure S1 and a selection transistor T1. The memory cell CM further comprises a selection node WL, a first input/output node SL and a second input/output node BL. The upper electrode EL1 of the storage structure S1 is connected to the second input/output node BL of the memory cell CM. The selection node WL is intended to receive a selection signal VWL. The gate of the selection transistor T1 is connected to the selection node WL. The selection transistor T1 is configured so as to connect the lower electrode EL2 to the first input/output node SL. Thus, the memory cell CM can only be set (SET) or reset (RESET) when the transistor T1 is in the on state. In addition, the transistor T1 makes it possible to limit the current passing through the storage structure S1 during a SET operation. Current limitation protects the structure S1 from the risk of internal structural destruction due to the presence of potentially high currents during the transition from a high resistive state to a low resistive state.

Generally, it is possible to produce, within the framework of the invention, memory cells of OxRAM or CbRAM type or any other non-volatile resistive memory technology.

Generally, the invention relates to a data storage circuit 1 of NOR type comprising a three-dimensional memory structure 10, a control circuit 20 and an interconnection structure 30. The three-dimensional memory structure 10 is intended to store data in its constituent memory cells CM. The control circuit 20 is configured to apply control voltages VBL, VSL and VWL to the nodes of each memory cell. The interconnection structure 30 is intended to connect the control circuit 20 to the three-dimensional memory structure 10, so as to propagate the control signals associated with each of the memory cells CM.

Figure 2:
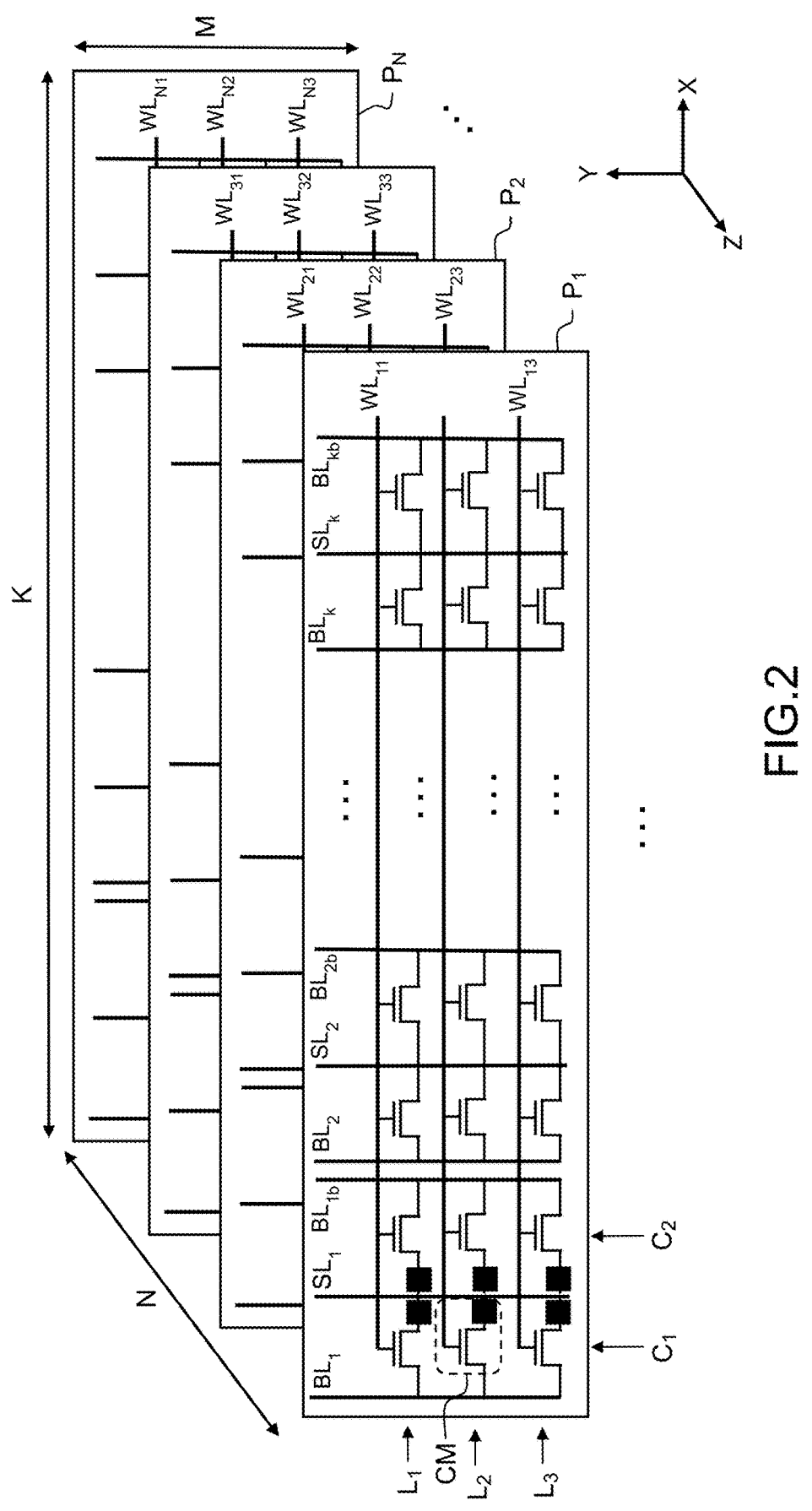
FIG. 2 illustrates an electrical schematic of the three-dimensional memory structure used in the storage circuit according to the invention.

In order to clearly explain the invention, the three-dimensional memory structure 10 will first be described. FIG. 2 illustrates an electrical schematic of the three-dimensional memory structure used in the storage circuit according to the invention.

The three-dimensional memory structure 10 comprises a plurality of successive memory planes $P_i$ of ranks i from 1 to N, with N a natural number greater than 1. The memory planes $P_i$ extend parallel to the geometric plane (X,Y) in an orthonormal coordinate system (X,Y,Z). Each memory plane forms a two-dimensional array of memory cells CM. Each array comprises M rows $L_j$, and K columns $C_k$. By way of illustrative example, the number of rows per array is equal to 3.

In each memory plane $P_i$, the selection nodes WL of the memory cells belonging to a given row $L_j$ are interconnected by a common selection line $WL_{ij}$. In each memory plane $P_i$, the first input/output nodes SL of the memory cells belonging to a given column $C_k$ are interconnected by a common source line denoted $SL_k$. In each memory plane $P_i$, the second input/output nodes BL of the memory cells belonging to a given column $C_k$ are interconnected via a common bit line denoted $BL_k$.

Advantageously and without loss of generality, in each memory plane $P_i$, the memory cells CM of a column $C_k$ of odd order share the same source line with the memory cells of the following adjacent column $C_{k+1}$ of even order. By way of non-limiting example, each memory cell CM of a column $C_k$ of odd order receives, via a bit line $BL_k$, a control signal $VBL_k$ complementary to the control signal, denoted $VBL_{kb}$, received by the memory cell of the following adjacent column $C_{k+1}$ of even order, on bit line $BL_{kb}$. This architecture has the advantage of a more compact three-dimensional structure with optimization of the number of bit lines and source lines.

The selection lines $WL_{ij}$, are independent of one another. When a logic operation is performed in parallel on all the planes (YZ), any memory cell may be opened or closed using an independent selection node $WL_{ij}$. The selection lines $WL_{ij}$, are independent within a given plane (YZ) and all the cells not used during a logic operation remain closed. This makes it possible to limit leakage currents in columns of rank j across all the memory planes $P_i$.

Figure 3A:
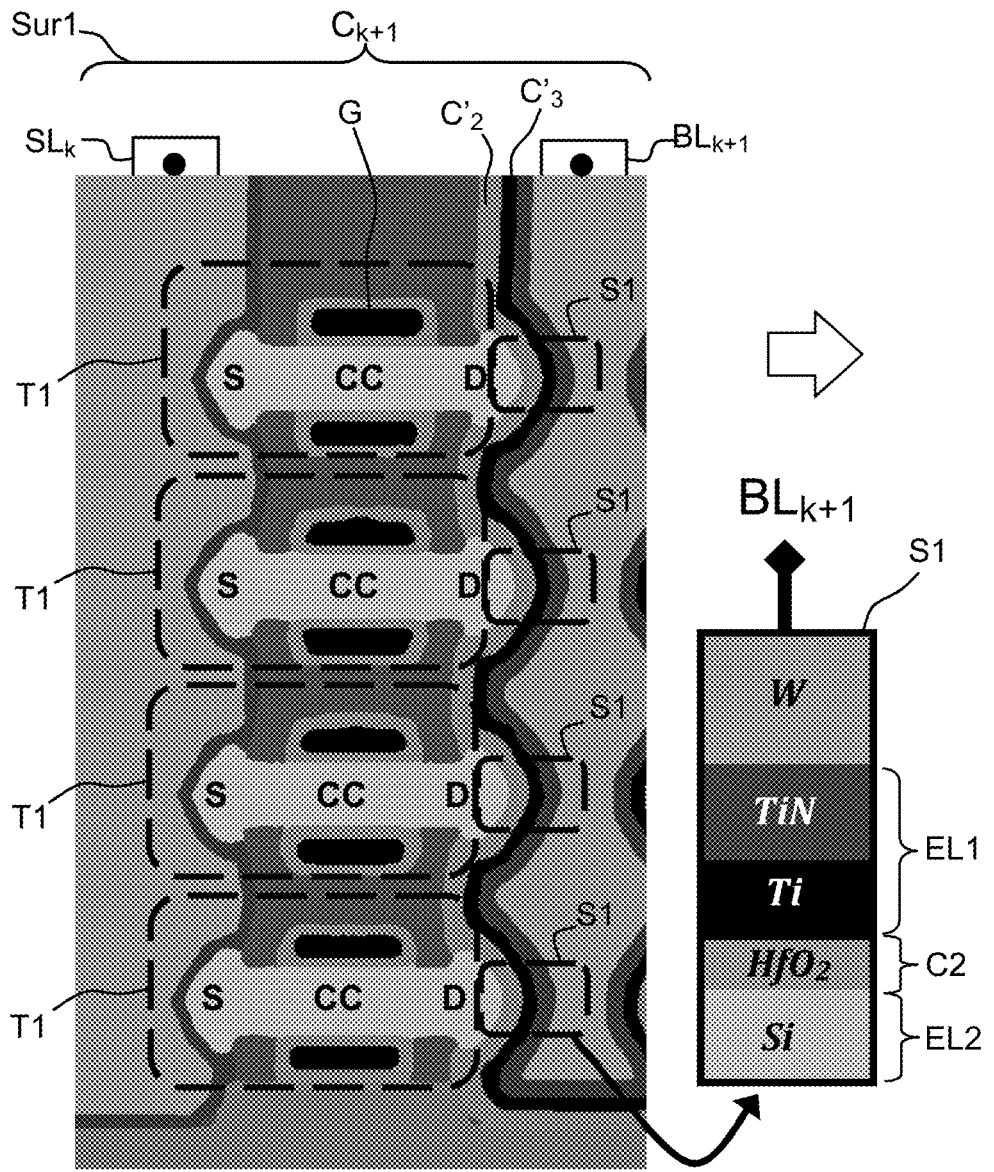
FIG. 3a illustrates a cross-sectional view of the thin-layer structure of a column of memory cells of the storage circuit according to the invention.

FIG. 3a illustrates a cross-sectional view of one embodiment of the thin-layer structure of a column $C_{k+1}$ of four memory cells CM of a three-dimensional memory structure 10 according to the invention. The materials used are presented by way of non-limiting illustration.

The column $C_{k+1}$ comprises a first metal pillar forming the common source line $SL_k$ and a second metal pillar forming the common intersection line $BL_{kb}$. The column further comprises a stack of four independent gate-all-around transistors separated by an insulating material. Each transistor corresponds to the selection transistor T1 of a memory cell. Each transistor comprises a silicon conduction channel CC having a first end corresponding to the drain and a second end corresponding to the source. The use of gate-all-around transistors allows the leakage currents of the structure to be considerably decreased. In addition, gate-all-around transistors are stackable on top of one another to produce a dense structure according to the invention. The side wall on the drain side of the set of transistors is covered with a succession of layers. The succession of layers comprises, in this order, a first layer C'2 made of a dielectric material such as hafnium oxide ($HfO_2$), then a first metal layer C'3 made of titanium (Ti), then a second metal layer made of titanium nitride (TiN) for example. The succession of layers obtained on each drain of a transistor T1 forms a resistive storage structure S1 corresponding to the stack of FIG. 1a. The upper electrode EL1 is composed of the assembly consisting of the first metal layer made of titanium and of the second metal layer made of titanium nitride. The central layer C2 is the hafnium-oxide layer. The lower electrode EL2 corresponds to the end of the channel of the transistor T1. Advantageously, it is envisageable to deposit an additional metal layer between the end of the channel of the transistor T1 and the first layer C'2 made of dielectric material, to improve the electrical contact to the lower electrode EL2.

A transistor T1 and the resistive storage structure S1 that is connected thereto together form a memory cell CM according to the invention. A stack of four memory cells CM is thus formed.

The column $C_{k+1}$ is obtained by producing the following arrangement: the first metal pillar $SL_k$ placed in contact with all the second ends corresponding to the source; and the second metal pillar $BL_{kb}$ placed in contact with all of the upper electrodes EL1.

The first metal pillar $SL_k$ extends as far as to the upper face Sur1 of the three-dimensional memory structure 10, in order to form the associated first connector. The second metal pillar $BL_{k+1}$ extends as far as to the upper face Sur1 of the three-dimensional memory structure 10, in order to form the associated second connector. At the upper surface the connectors form the access points to the bit lines and source lines, in order to allow the control voltages VBL and VSL to be applied during an operation of reading and/or writing to a selected memory cell CM.

The structure shown in FIG. 3a allows the circuit according to the invention to be physically implemented with a higher geometric density than known non-volatile memories of NOR type. More particularly, the memory structure 10 allows a plurality of 1T1R memory cells (1T1R standing for one transistor, one resistor) to be formed with a more compact three-dimensional structure than known solutions.

Figure 3B:
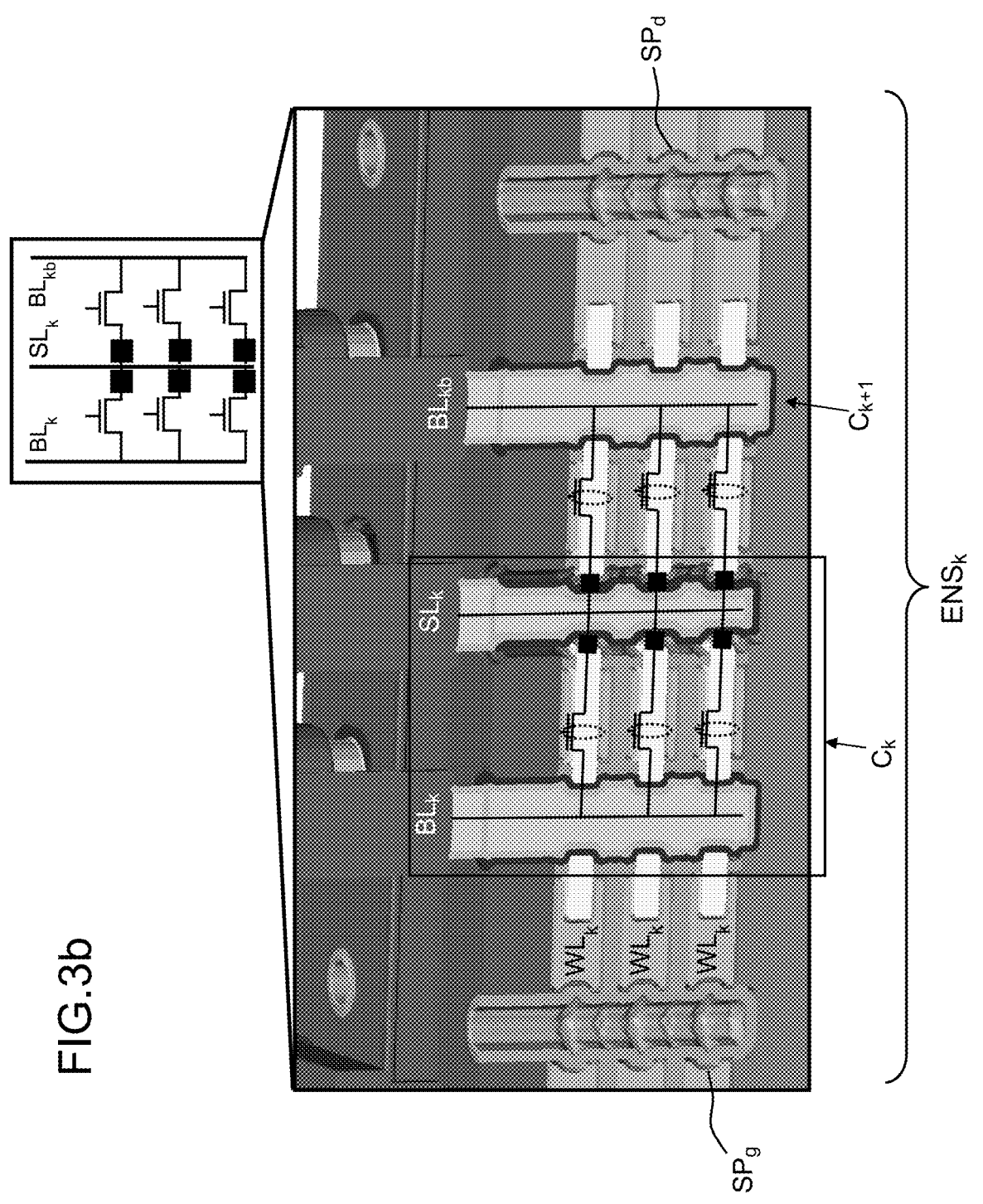
FIG. 3b illustrates a cross-sectional view of the thin-layer structure of two adjacent columns of memory cells of the storage circuit according to the invention.

FIG. 3b illustrates a cross-sectional view of the thin-layer structure of two adjacent columns $C_k$ and $C_{k+1}$ of a given memory plane $P_i$ and sharing a common source line $SL_k$. The two adjacent columns then have a common connection pillar corresponding to the common source line $SL_k$. The assembly formed by these two columns $C_k$ and $C_{k+1}$ is denoted $ENS_k$. The assembly $ENS_k$ is bounded on each side by a left boundary pillar $SP_g$ and a right boundary pillar $SP_d$. Thus, each memory plane $P_i$ is composed of a repetition of assemblies $ENS_k$ separated by boundary pillars filled with a dielectric material.

In the illustrated example, each column comprises a stack of three memory cells. Thus, each assembly $ENS_k$ comprises six memory cells CM, two boundary pillars $SP_g$ and $SP_d$, three connection pillars $BL_k$, $SL_k$ and $BL_{kb}$, which open onto three connectors, and three selection tracks $WL_1$ to $WL_3$.

Figure 3C:
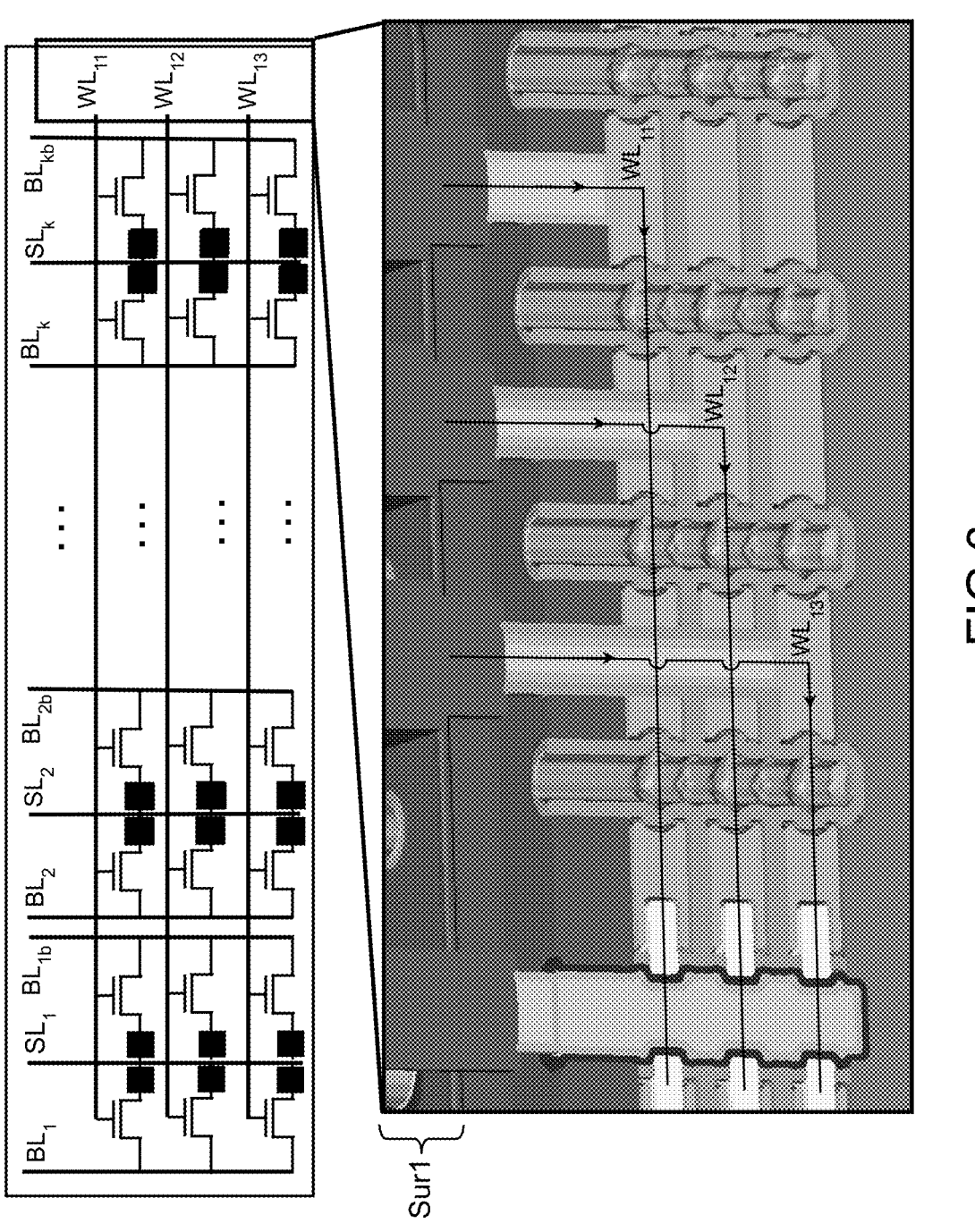
FIG. 3c illustrates a cross-sectional view of the thin-layer structure of the connection pillars used to transmit the selection signals of the storage circuit according to the invention.

FIG. 3c illustrates a cross-sectional view of the thin-layer structure of the connection pillars used to transmit the selection signals of a given memory plane $P_i$. It will be recalled that, for each plane $P_i$, one selection signal $VWL_{ij}$, is propagated for each row of the plane $L_j$. Each selection signal $VWL_{ij}$, is propagated via a metal selection track, which crosses the plane $P_i$ horizontally. Electrical access to each selection track is provided by a dedicated selection pillar. Each selection pillar is a metal pillar that extends vertically to connect the associated horizontal track to a connector located on the upper surface Sur1. Thus, three connectors are obtained for each memory plane $P_i$. The difference in level between the horizontal selection tracks induces a stepped structure formed by the pillars.

Advantageously, the pillars of the selection signals $VWL_{ij}$, are separated from one another by boundary pillars similar to those described above.

Figure 3D:
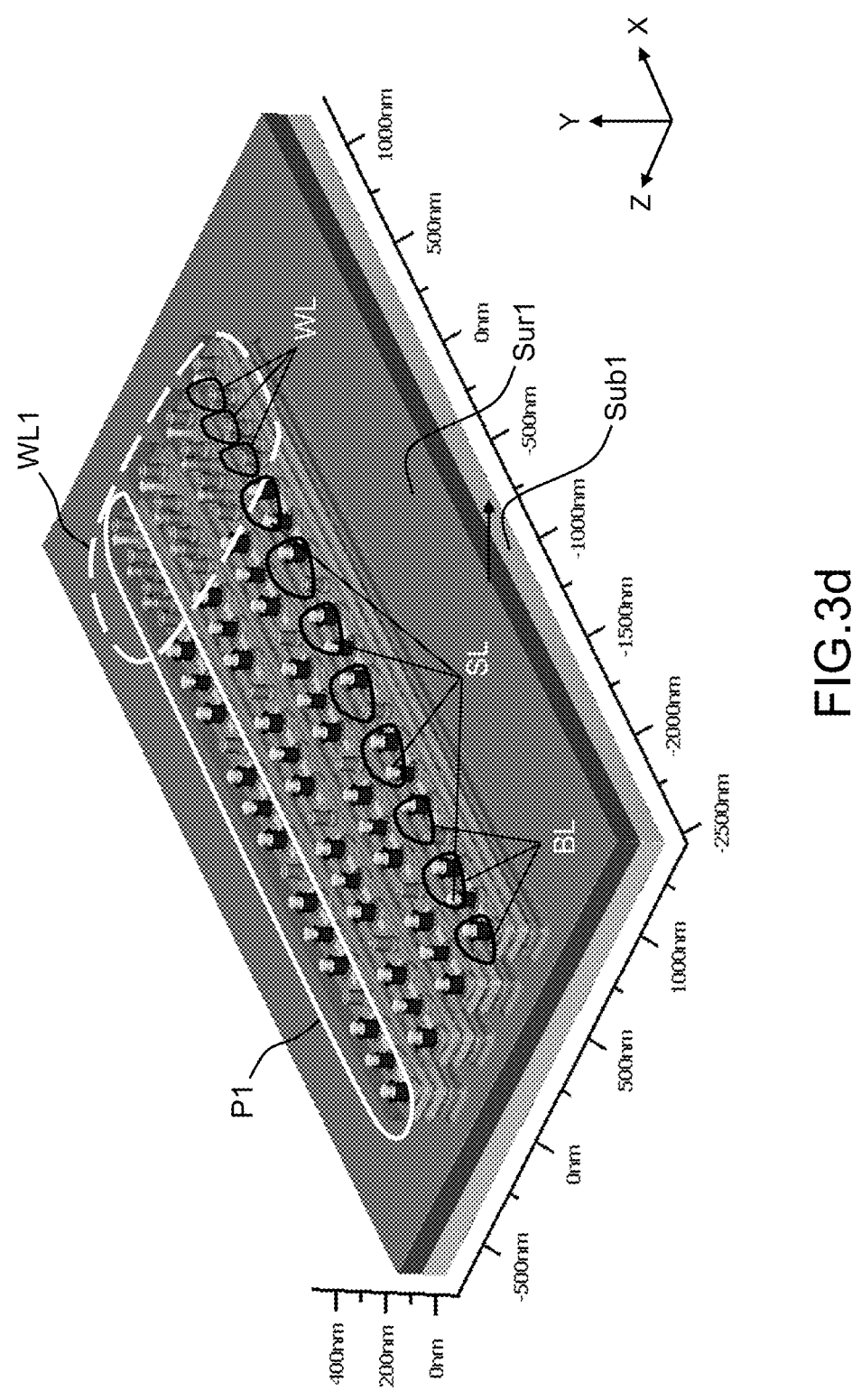
FIG. 3d illustrates a perspective view of the three-dimensional memory structure used in the storage circuit according to the invention.

FIG. 3d illustrates a perspective view of the three-dimensional memory structure 10 used in the storage circuit according to the invention. The 3D array structure is produced on a semiconductor substrate SUB1. The upper surface Sur1 comprises a plurality of connectors SL, BL and WL. The connectors are distributed in a plurality of rows along the X-axis. Each row of connectors corresponds to one memory plane $P_i$ of rank i. At the end of each row of connectors, there are M=3 selection connectors WL. The number of selection connectors WL corresponds to the number of rows $L_j$ of a memory plane. For each row, the connectors are distributed to reflect the repetition of the triplet $BL_k$, $SL_k$, $BL_{k+1}$ corresponding to the electrical accesses to the lines of a memory-cell assembly $ENS_k$. It may be seen that the triplets are separated by the boundary-pillar ends lying exposed on the upper surface Sur1.

The distribution of the connectors BL, SL and WL of the memory cells of the three-dimensional memory structure 20 has thus been described. The connectors are the electrical accesses used to apply control and selection signals during operations of reading and writing to any of the memory cells $CM_{ijk}$, with i the rank of the memory plane $P_i$, j the rank of row $L_j$ of the memory cell, and k the rank of its column $C_k$. Each memory cell $CM_{ijk}$ is selectable by the connector associated with its selection node $WL_{ij}$. The memory cell $CM_{ijk}$ is written to and read by applying a first voltage VSL to its associated first connector $SL_{jk}$ and applying a second voltage VBL to its associated second connector $BL_{jk}$.

Figure 4A:
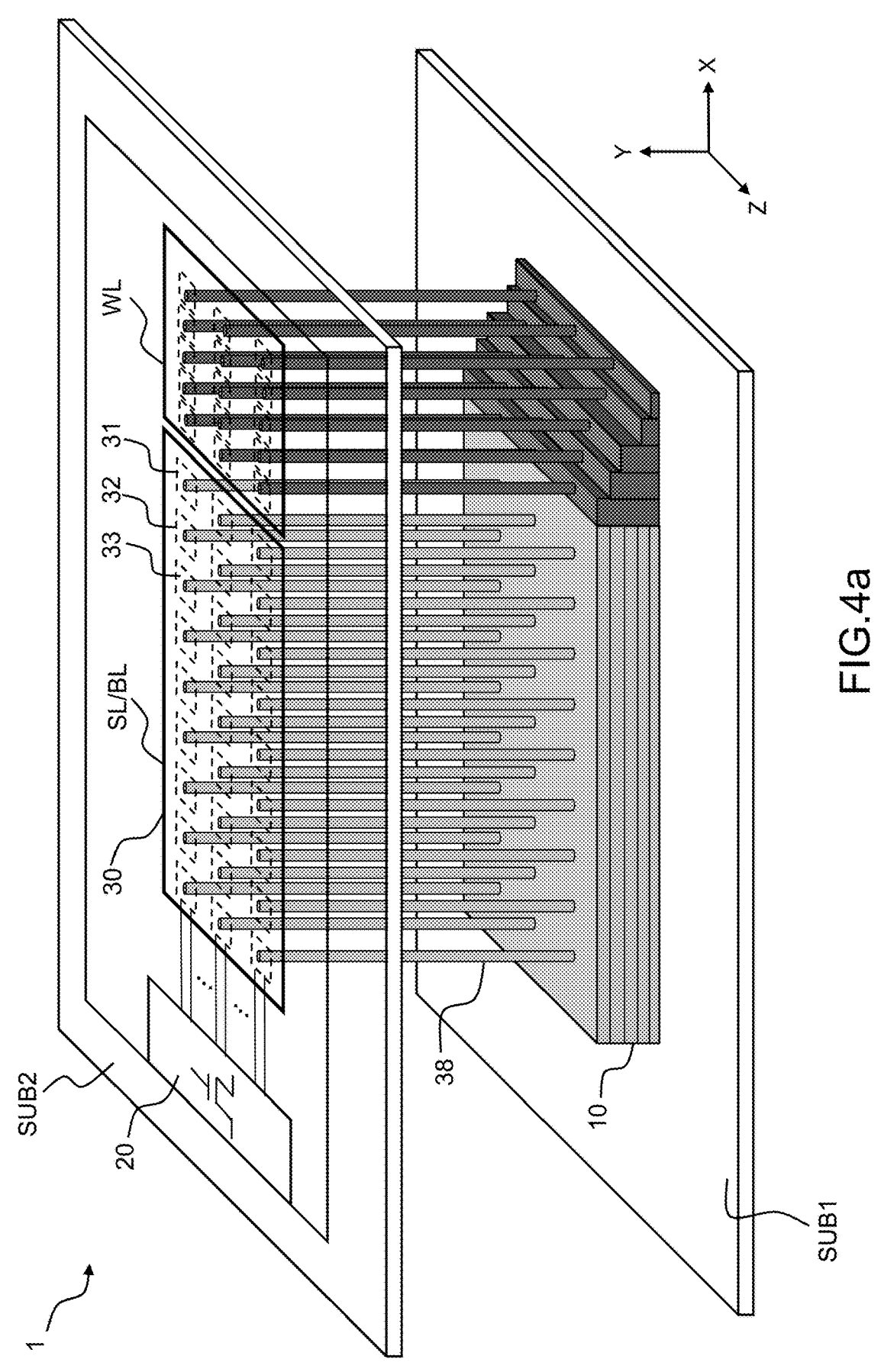
FIG. 4a illustrates a perspective view of the storage circuit according to the invention.

FIG. 4a illustrates a perspective view of the storage circuit 1 according to the invention. The data storage circuit 1 comprises the described three-dimensional memory structure 10, a control circuit 20 and an interconnection structure 30. The control circuit 20 is configured to apply control voltages VBL, VSL and VWL to the nodes of each memory cell. The interconnection structure 30 is intended to connect the control circuit 20 to the three-dimensional memory structure 10 through the connectors on the upper surface Sur1 of said structure 10.

The control circuit 20 is a CMOS integrated circuit produced on the upper face of a second semiconductor substrate SUB2. The lower face of the second semiconductor substrate SUB2 is superposed on the upper surface Sur1 of the three-dimensional memory structure 10. A stack formed by the three-dimensional memory structure 10 and the control circuit 20 is thus obtained along the Y-axis. Production on two separate semiconductor substrates has a number of advantages:

the spatial density of the storage circuit is improved; and the control circuit is able to use CMOS transistors at advanced technological nodes (<28 nm). Specifically, it is difficult to use transistors of this type on the same substrate as the one bearing the three-dimensional memory structure 10. This difficulty is due to the following factors: the selection transistors integrated into the three-dimensional structure are optimized for density, not for logic performance. The fabrication process, when applied to just one substrate, requires each transistor of the control circuit to be constructed with the same structure as the selection transistors of the three-dimensional structure. This implies a considerable decrease in the performance of the control circuit, compared to the case where transistors of advanced technological node are used; and A vertical connection (along Y) is employed rather than a horizontal connection (in the plane of the first substrate SUB1). This allows the number of levels of metal tracks required to connect the control circuit 20 to the three-dimensional memory structure 10 to be decreased.

It has already been mentioned that electrical access to each node BL, SL and WL of a memory cell $CM_{ijk}$ is achieved via connectors distributed on the upper surface Sur1. The interconnection structure 30 makes it possible to make the electrical connection between the connectors of the memory structure 10 and the control circuit 20 in the described stacked configuration. The interconnection structure 30 is an interface confined between the memory structure 10 and the control circuit 20. The interconnection structure 30 comprises a plurality of bonding pads 31, 32, 33 placed between the control circuit 20 and said upper surface Sur1. The bonding pads 31, 32, 33 are metal layers that lie in a plane parallel to the upper surface Sur1 and have a thickness comprised between 10 nm and 500 nm.

Figure 4B:
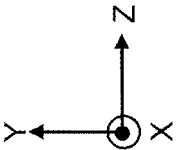
FIG. 4b illustrates a cross-sectional view of the storage circuit according to a first embodiment of the invention.

In order to allow the physical implementation of the interconnection structure 30 to be better understood, FIG. 4b illustrates a partial cross-sectional view of the storage circuit 1 showing a bonding pad 31 according to a first embodiment. Without loss of generality, a single connection has been illustrated for the sake of simplification of the illustration.

In order to propagate a control signal $VBL_{k1}$ delivered by the control circuit 20 to at least one associated first input/output node $BL_{k1}$, the interconnection structure 30 comprises: a first through-via 39 that passes through the second semiconductor substrate SUB2 so as to be able to transmit the control signal $VBL_{k1}$, a bonding pad 31 placed between the second semiconductor substrate SUB2 and said upper surface Sur1; and a second via 38 connecting the bonding pad 31 to a horizontal connection track 41. The horizontal connection track 41 is deposited on the upper surface Sur1. The first via 39 is a TSV (acronym of Through-Silicon Via). It extends as far as to the upper metallization level Mx of the control circuit 20. This embodiment corresponds to back-to-face bonding because the bonding interface is between the upper surface Sur1 of the three-dimensional memory structure 10 and the lower face of the second substrate SUB2.

In the context of the invention, a bonding pad 31 is common to a plurality of memory cells CM belonging to a plurality of successive planes $P_{i1}$ to $P_{i2}$ (i1<i2) et belonging to columns $C_k$ of a given rank k. The communality of the bonding pads 31 is achieved via the horizontal connection track 41.

Advantageously, the three-dimensional memory structure 10 is encapsulated in a dielectric layer 60. The bonding pad is placed on the dielectric layer 60 so as to make an electrical connection with the second via 38. The second via 38 passes through the dielectric layer 60 to the metal track 41 and/or a connector on the upper surface Sur1.

The control circuit 20 is bonded by stacking to the three-dimensional memory structure 10 using a hybrid bonding technique. By hybrid bonding, what is meant is simultaneous metal-metal and dielectric-dielectric direct bonding. Using the conductivity of metals and the insulating nature of dielectrics, hybrid bonding is employed to manufacture a plurality of bonding pads. Before bonding, the lower face is manufactured so as to obtain a dielectric surface comprising a first group of metal pads. Likewise, the upper surface of the dielectric encapsulation layer 60 comprises a second group of metal pads having the same planar coordinates as the first group. Next, hybrid bonding is used to produce the 3D assembly, while creating the interconnections with the bonding pads 31, 32 and 33. By way of non-limiting example, the bonding pads 31, 32 and 33 are copper pads and the hybrid bonding is copper-copper and $SiO_2$—$SiO_2$ bondingtype.

The structure described above may also be used to make connections associated with the first input/output nodes SL and selection nodes WL.

The bonding pads 31, 32 and 33 must be separate from one another to avoid short-circuits and must at the same time be placed as close as possible to the associated memory cells to improve the performance of the read and write operations. Thus, it is necessary to satisfactorily optimize the spatial distribution of the bonding pads 31 with respect to the upper surface Sur1.

Figure 4C:
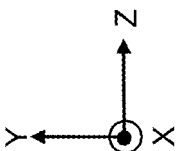
FIG. 4c illustrates a cross-sectional view of the storage circuit according to a second embodiment of the invention.
Figure 4C:
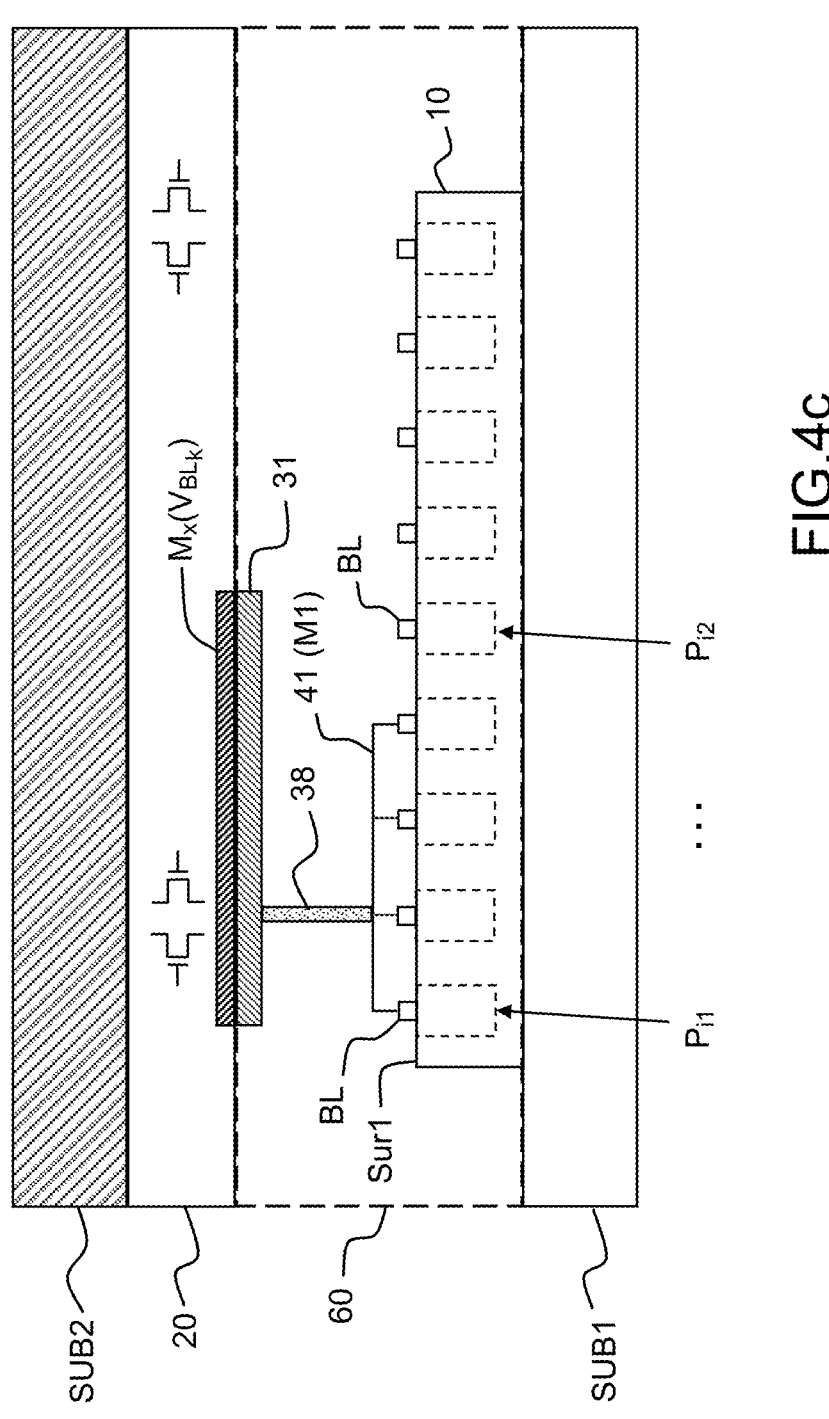

Alternatively, FIG. 4c illustrates a partial cross-sectional view of the storage circuit 1 showing a bonding pad 31 according to a second embodiment. Without loss of generality, a single connection has been illustrated for the sake of simplification of the illustration. The second embodiment corresponds to face-to-face bonding. Specifically, the bonding interface is between the upper surface Sur1 of the three-dimensional memory structure 10 and the upper face of the control circuit 20. More particularly, each bonding pad 31, 32 and 33 is bonded to a metal layer of the upper metallization level Mx of the control circuit 20 using the hybrid bonding technique described above. In this embodiment there is no need to use a through-via 39 passing right through the substrate SUB2 to make the electrical connection between the control circuit 20 and a bonding pad 31. This connection is made directly via the hybrid bonding, while ensuring alignment between the bonding pad and the associated metal layer of the upper metallization level Mx of the control circuit 20.

This embodiment makes it possible to overcome the constraints imposed by TSVs and thus for the density of the bonded structure to be improved.

FIGS. 5a-5e are intended to illustrate configurations of the spatial distribution of the bonding pads 31, 32 and 33 according to a number of embodiments of the invention.

Figure 5A:
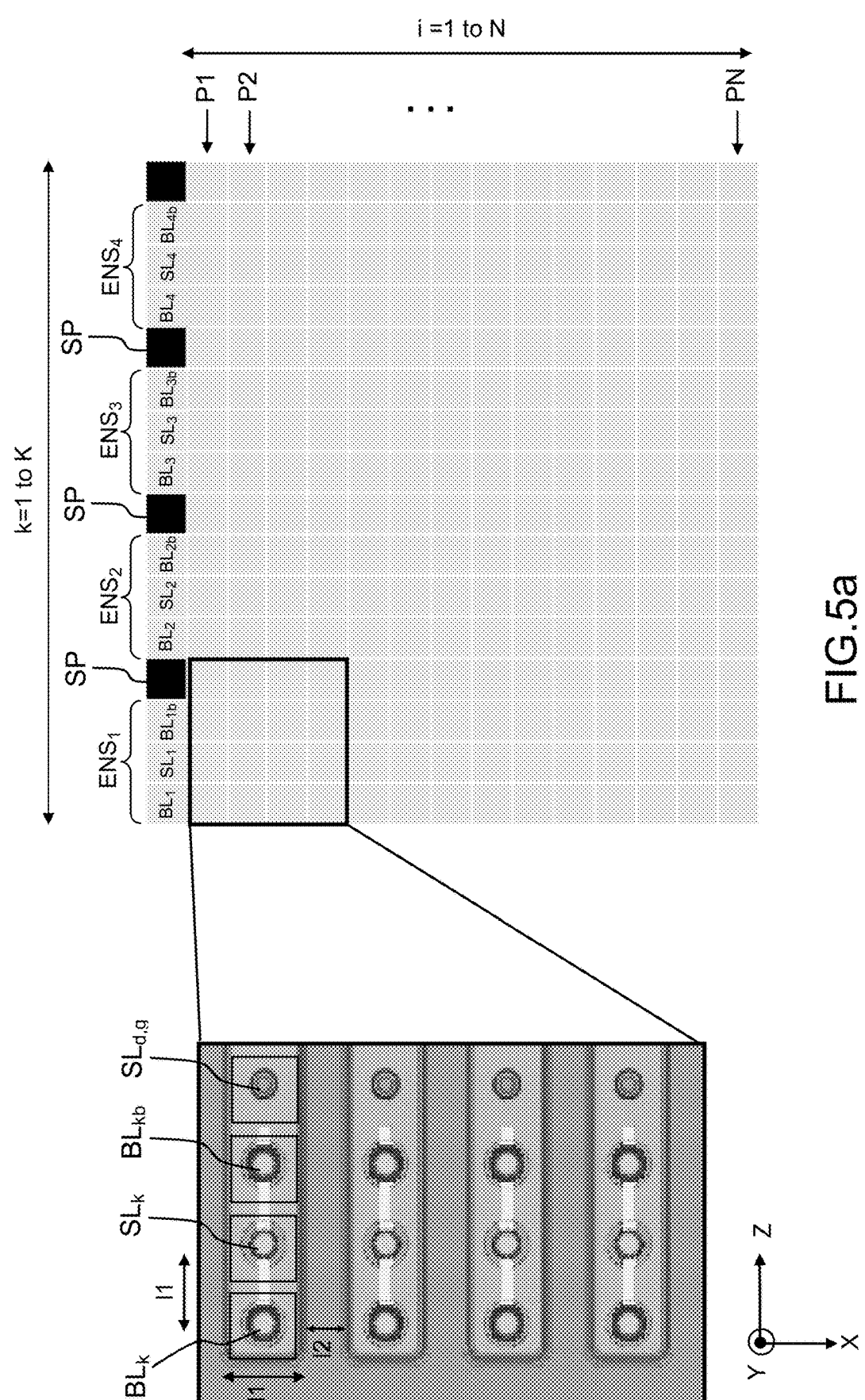
FIG. 5a illustrates a top view of the upper surface of the three-dimensional memory structure used in the storage circuit according to the invention.

FIG. 5a illustrates a top view of a division of the upper surface Sur1 of the three-dimensional memory structure 20 before placement of the bonding pads 31. By way of non-limiting example, the three-dimensional memory structure 10 of FIG. 3d is organized into triplets $BL_k$, $SL_k$, $BL_{kb}$ corresponding to the electrical accesses to the lines of a memory-cell assembly $ENS_k$. The memory-cell assemblies $ENS_k$ are separated by the boundary-pillar ends lying exposed on the upper surface Sur1. This view is a view of the plane (X,Z), in the orthonormal coordinate system referred to above. The upper surface Sur1 may be divided into a plurality of rectangular zones of equal area. Each rectangular zone is centred on an associated connector or on the exposed end of an associated boundary pillar.

Each row of the array formed by the illustrated rectangular zones contains one memory plane $P_i$. Adjacent connectors belonging to the same memory plane $P_i$ are separated from each other by a first distance $I_1$. Adjacent memory planes $P_i$ are separated from each other by a second distance $I_2$. If the array formed by the rectangular zones is skimmed across and down, a horizontal pitch (along the X-axis) equal to the first distance $I_1$ and a vertical pitch (along the Z-axis) equal to $I_1+I_2$, are obtained. When this type of division is employed, each rectangular zone covers one column of M memory cells.

By way of example, the first distance $I_1$ is equal to 160 nm and the second distance $I_2$ is equal to 100 nm, this yielding a rectangular zone of 0.0416 $\mu m^2$.

Having introduced the spatial division of the upper surface, the following section will now be devoted to description of the distribution of the bonding pads over this surface according to the invention.

Figure 5B:
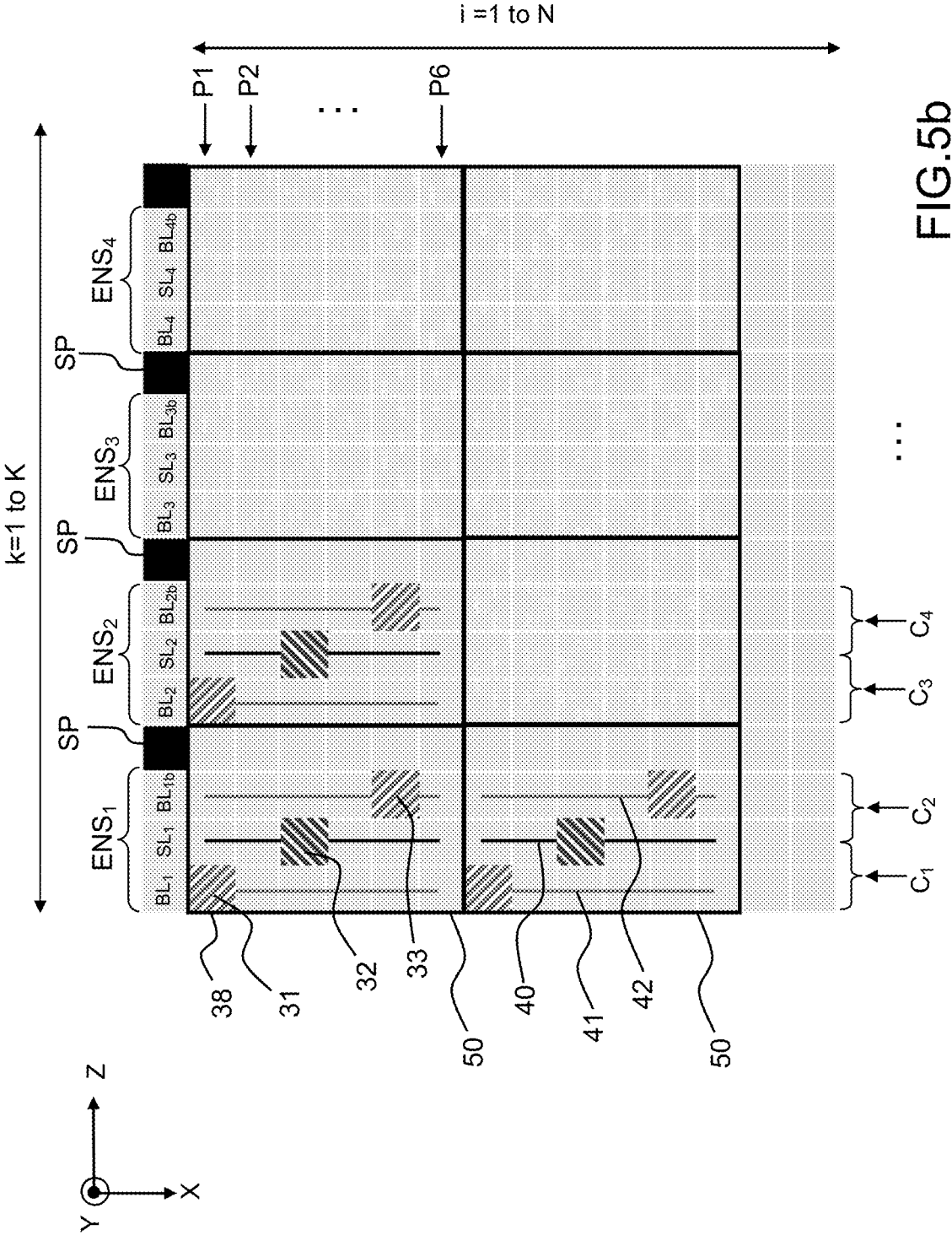
FIG. 5b illustrates a top view of the three-dimensional memory structure illustrating a first distribution of the bonding pads according to the invention.

FIG. 5b illustrates a top view of the three-dimensional memory structure illustrating the distribution of the bonding pads 31 according to a first embodiment of the invention. In this embodiment, it is assumed that the area of a bonding pad is equal to the area of a rectangular zone of the preceding division.

The plurality of bonding pads is formed by the periodic repetition of a unit pattern 50. In the illustrated case, each unit pattern 50 covers two consecutive columns $C_k$ and $C_{k+1}$ of memory cells CM belonging to six memory planes $P_i$. Each column $C_k$ comprises M memory cells. Thus, each unit pattern 50 covers one elementary group 51 of memory cells. A unit pattern 50 covers a sub-array of 6 rows and 4 pillars when the division of FIG. 5b is employed (6×4 rectangular regions).

In the illustrated embodiment, each elementary group 51 thus comprises "M*2 columns*6 memory planes" of memory cells $CM_{ijk}$ in the case of three bonding pads 31, 32 and 33. The bonding pads coincide with their through-vias (represented by the hatching), which connect them to the connectors.

The first bonding pad 31 is connected to the connector $BL_k$ of the memory cell of the first column of the elementary group 51, which belongs to the initial plane $P_{i1}$ of the elementary group 51. The first bonding pad 31 is placed in the zone of coordinate (1,1) in the sub-array corresponding to the unit pattern 50. The second input/output nodes BL of the memory cells belonging to the first column are interconnected via the metal track 41.

The second bonding pad 32 is connected to the connector $SL_k$ of the memory cells of the third plane $P_{i1+2}$ of the elementary group 51. The second bonding pad 31 is placed in the zone of coordinate (3,2) in the sub-array corresponding to the unit pattern 50. The first input/output nodes SL of the memory cells belonging to the set of the unit pattern 50 are interconnected via the metal track 40.

The third bonding pad 32 is connected to the connector $BL_{k+1}$ of the memory cell of the second column of the elementary group 51, which belongs to the penultimate plane $P_{i1+4}$ of the elementary group 51. The third bonding pad 31 is placed in the zone of coordinate (5,3) in the sub-array corresponding to the unit pattern 50. The second input/output nodes BL of the memory cells belonging to the second column are interconnected via the metal track 42.

By virtue of the optimized bonding-pad distribution described above, it is possible to produce a memory architecture of NOR type. Specifically, the described interconnection structure allows access to the various memory cells to be optimized, so as to increase parallelism with respect to the case of direct routing to the three-dimensional structure. As a result, it is possible to carry out read and write operations independently in each elementary group 51 corresponding to one unit pattern. This allows read and write operations to be carried out in parallel by virtue of this independence. The increase in parallelism allows constraints of the prior art, and more specifically the constraints of a NAND structure, to be overcome. In effect, in a NAND structure, operation of the memory cells is interdependent in the three-dimensional structure, requiring application of inhibition signals to prevent undesired write or read operations. In addition, the sequential access in a NAND structure involves biasing all the transistors in series to turn them on and access the target memory cell. Thus, the 3D NOR structure according to the invention and the proposed connectivity make it possible to combine, at the same time, the compactness of a 3D structure with the parallelism of operations of a NOR memory structure. Thus, the structure according to the invention allows direct access to each input/output node BL,SL and each selection node WL.

Figure 5C:
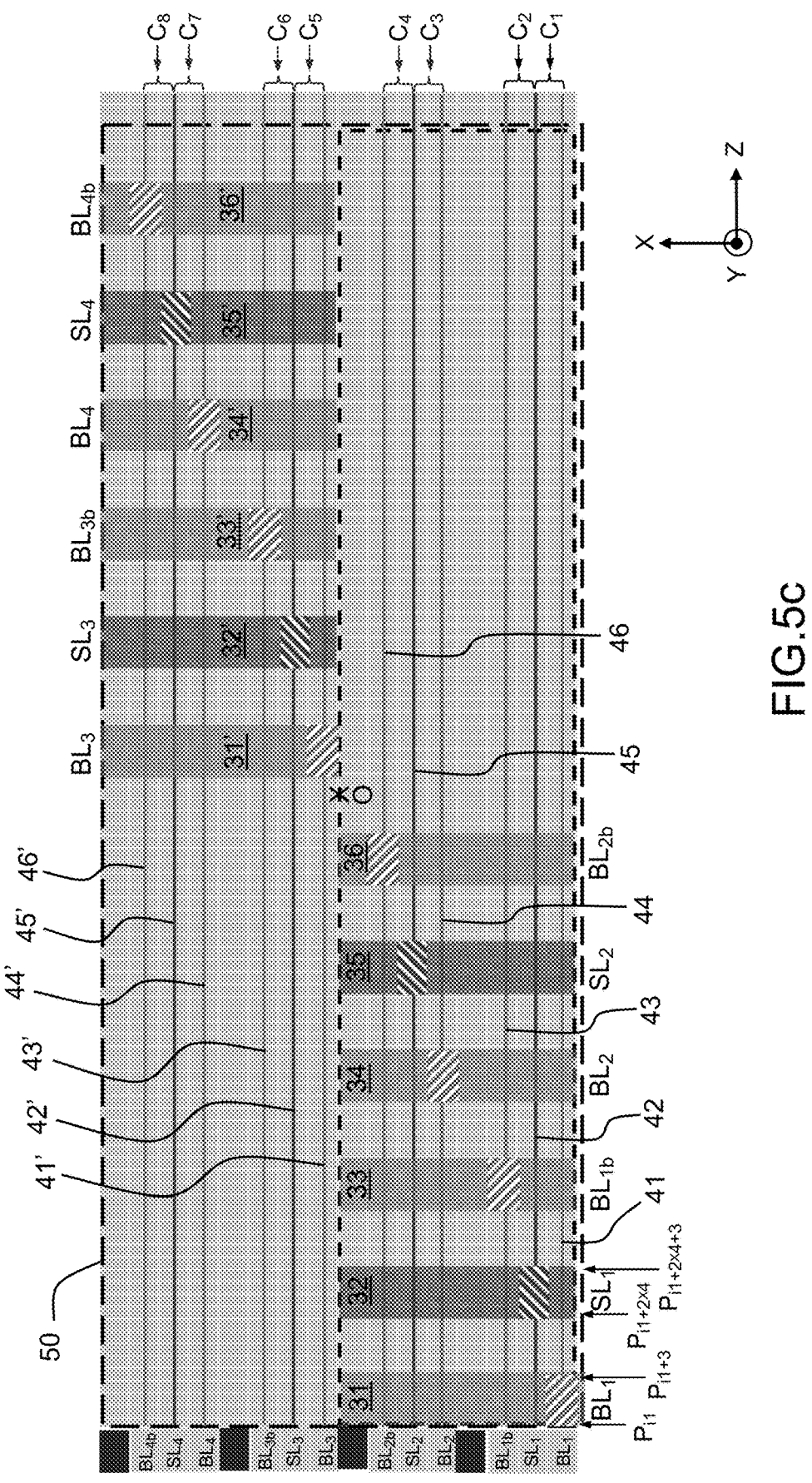
FIG. 5c illustrates a partial top view of the three-dimensional memory structure illustrating a second distribution of the bonding pads according to the invention.

FIG. 5*c* illustrates a top view of the three-dimensional memory structure illustrating the distribution of the bonding pads 31 according to a second embodiment of the invention. In this embodiment, it is assumed that the area of a bonding pad is greater than the area of a rectangular zone of the preceding division. In other words, in horizontal cross section, the area of a bonding pad is greater than the area of a via 38 below.

By way of illustrative and non-limiting example, a bonding pad is considered to be a square of side length e=1 μm and, thus, the area of a pad is equal to 1 μm². A rectangular zone of division of the upper surface is considered to have the following dimensions: the first distance $I_1$ is equal to 160 nm and the second distance $I_2$ is equal to 100 nm, this yielding a rectangular zone of 0.0416 μm². Thus, each bonding pad covers an area corresponding to four memory planes $P_i$ (along the Z-axis) and four columns $C_n$ (along the X-axis) corresponding to 8 rectangular zones of the division. The bonding pads must be spaced apart by a distance equivalent to four memory planes $P_i$ (along the Z-axis). The illustrated distribution corresponds to an optimal distribution pattern allowing the following constraints to be met:

a bonding-pad area of about one μm²;

a spacing between bonding pads greater than or equal to the side length of one bonding pad.

The unit bonding-pad pattern according to the invention must have a minimum area while meeting the aforementioned constraints. Minimizing the area of the unit pattern allows the number of associated elementary groups to be maximized. Thus, the connectivity of each elementary memory-cell group is independent of the connectivity of the other elementary groups. This implies an increase in the parallelism of read and write operations in the data storage circuit.

In the illustrated embodiment, the unit pattern 50 covers an elementary group 51 of memory cells comprising "M*6 columns*96 planes" memory cells $CM_{ijk}$ with 12 bonding pads 31 to 36 and 31' to 36. The bonding pads are larger than the through-vias (represented by the hatching), which pass through to the connectors.

The first bonding pad 31 is connected to the connector $BL_1$ of the memory cells of the first column of the elementary group 51, which belongs to the first 4 memory planes $P_{i1}$ to $P_{i1+3}$ of the elementary group 51. The connection is made by a through-via (hatching) that connects to the connectors of the input/output nodes BL of the aforementioned memory cells. The second input/output nodes BL of the memory cells belonging to the first column $C_1$ of the 96 memory planes of the elementary group 51 are interconnected via the metal track 41.

The second bonding pad 32 is connected to the connector $SL_1$ of the memory cells of the first column of the elementary group 51, which belongs to the 4 memory planes $P_{i1+2×4}$ to $P_{i1+2*4+3}$ of the elementary group 51. The connection is made by a through-via (hatching) that connects to the connectors of the input/output nodes SL of the aforementioned memory cells. The first input/output nodes SL of the memory cells belonging to the first column $C_1$ of the 96 memory planes of the elementary group 51 are interconnected via the metal track 42.

The third bonding pad 33 is connected to the connector $BL_{1b}$ of the memory cells of the second column $C_2$ of the elementary group 51, which belongs to the 4 memory planes $P_{i1+4×4}$ to $P_{i1+4*4+3}$ of the elementary group 51. The connection is made by a through-via (hatching) that connects to the connectors of the input/output nodes BL of the aforementioned memory cells. The second input/output nodes BL of the memory cells belonging to the second column $C_2$ of the 96 memory planes of the elementary group 51 are interconnected via the metal track 43.

The fourth bonding pad 34 is connected to the connector $BL_2$ of the memory cells of the third column $C_3$ of the elementary group 51, which belongs to the 4 memory planes $P_{i1+6×4}$ to $P_{i1+6*4+3}$ of the elementary group 51. The connection is made by a through-via (hatching) that connects to the connectors of the input/output nodes BL of the aforementioned memory cells. The second input/output nodes BL of the memory cells belonging to the third column $C_3$ of the 96 memory planes of the elementary group 51 are interconnected via the metal track 44.

The fifth bonding pad 35 is connected to the connector $SL_2$ of the memory cells of the third column $C_3$ of the elementary group 51, which belongs to the 4 memory planes $P_{i1+8×4}$ to $P_{i1+8*4+3}$ of the elementary group 51. The connection is made by a through-via (hatching) that connects to the connectors of the input/output nodes SL of the aforementioned memory cells. The first input/output nodes SL of the memory cells belonging to the third column $C_3$ of the 96 memory planes of the elementary group 51 are interconnected via the metal track 45.

The sixth bonding pad 36 is connected to the connector $BL_{2b}$ of the memory cells of the fourth column $C_4$ of the elementary group 51, which belongs to the 4 memory planes $P_{i1+10×4}$ to $P_{i1+10*4+3}$ of the elementary group 51. The connection is made by a through-via (hatching) that connects to the connectors of the input/output nodes BL of the aforementioned memory cells. The second input/output nodes BL of the memory cells belonging to the fourth column $C_4$ of the 96 memory planes of the elementary group 51 are interconnected via the metal track 46.

The seventh bonding pad 31' is connected to the connector $BL_3$ of the memory cells of the fifth column $C_5$ of the elementary group 51, which belongs to the 4 memory planes $P_{i1+12×4}$ to $P_{i1+12*4+3}$ of the elementary group 51. The connection is made by a through-via (hatching) that connects to the connectors of the input/output nodes BL of the aforementioned memory cells. The second input/output nodes BL of the memory cells belonging to the fifth column $C_5$ of the 96 memory planes of the elementary group 51 are interconnected via the metal track 41'.

The eighth bonding pad 32' is connected to the connector $SL_3$ of the memory cells of the fifth column $C_5$ of the elementary group 51, which belongs to the 4 memory planes $P_{i1+14\times4}$ to $P_{i1+14*4+3}$ of the elementary group 51. The connection is made by a through-via (hatching) that connects to the connectors of the input/output nodes SL of the aforementioned memory cells. The first input/output nodes SL of the memory cells belonging to the fifth column $C_5$ of the 96 memory planes of the elementary group 51 are interconnected via the metal track 42'.

The ninth bonding pad 33' is connected to the connector $BL_{3b}$ of the memory cells of the fourth column $C_6$ of the elementary group 51, which belongs to the 4 memory planes $P_{i1+16\times4}$ to $P_{i1+16*4+3}$ of the elementary group 51. The connection is made by a through-via (hatching) that connects to the connectors of the input/output nodes BL of the aforementioned memory cells. The second input/output nodes BL of the memory cells belonging to the sixth column $C_6$ of the 96 memory planes of the elementary group 51 are interconnected via the metal track 43'.

The tenth bonding pad 34' is connected to the connector $BL_4$ of the memory cells of the seventh column $C_7$ of the elementary group 51, which belongs to the 4 memory planes $P_{i1+18\times4}$ to $P_{i1+18*4+3}$ of the elementary group 51. The connection is made by a through-via (hatching) that connects to the connectors of the input/output nodes BL of the aforementioned memory cells. The second input/output nodes BL of the memory cells belonging to the seventh column $C_7$ of the 96 memory planes of the elementary group 51 are interconnected via the metal track 44'.

The eleventh bonding pad 35' is connected to the connector $SL_4$ of the memory cells of the seventh column $C_7$ of the elementary group 51, which belongs to the 4 memory planes $P_{i1+20\times4}$ to $P_{i1+20*4+3}$ of the elementary group 51. The connection is made by a through-via (hatching) that connects to the connectors of the input/output nodes SL of the aforementioned memory cells. The first input/output nodes SL of the memory cells belonging to the seventh column $C_7$ of the 96 memory planes of the elementary group 51 are interconnected via the metal track 45'.

The twelfth bonding pad 36' is connected to the connector $BL_{4b}$ of the memory cells of the eighth column $C_8$ of the elementary group 51, which belongs to the 4 memory planes $P_{i1+22\times4}$ to $P_{i1+22*4+3}$ of the elementary group 51. The connection is made by a through-via (hatching) that connects to the connectors of the input/output nodes BL of the aforementioned memory cells. The second input/output nodes BL of the memory cells belonging to the eighth column $C_8$ of the 96 memory planes of the elementary group 51 are interconnected via the metal track 46'.

The bonding pads 31' to 36' are symmetrical to the bonding pads 31 to 36 with respect to the centre O of the unit pattern 50. It is a question of a central symmetry between two groups of pads, the two groups being identical in number and shape. This arrangement makes it possible to obtain a better spatial bonding-pad density.

Generally, along the Z-axis the bonding pads are periodically repeated with a period equal to 2 times the number of memory planes covered by a bonding pad. Let x1 be the number of triplets $ENS_k$ covered by the area of one bonding pad along the X-axis. The bonding pads are distributed in groups of 3*x1 pads. Each group of 3*x1 bonding pads is aligned with the columns $C_k$ associated with the dedicated assemblies $ENS_k$. In the illustrated case, 6 pads 31 to 36 are used to access the memory cells of 2 triplets $ENS_1$, and $ENS_2$. The order between bonding pads belonging to a given group has been presented here by way of example. It is possible to interchange the positions along the Z-axis of the bonding pads of a given group.

Figure 5D:
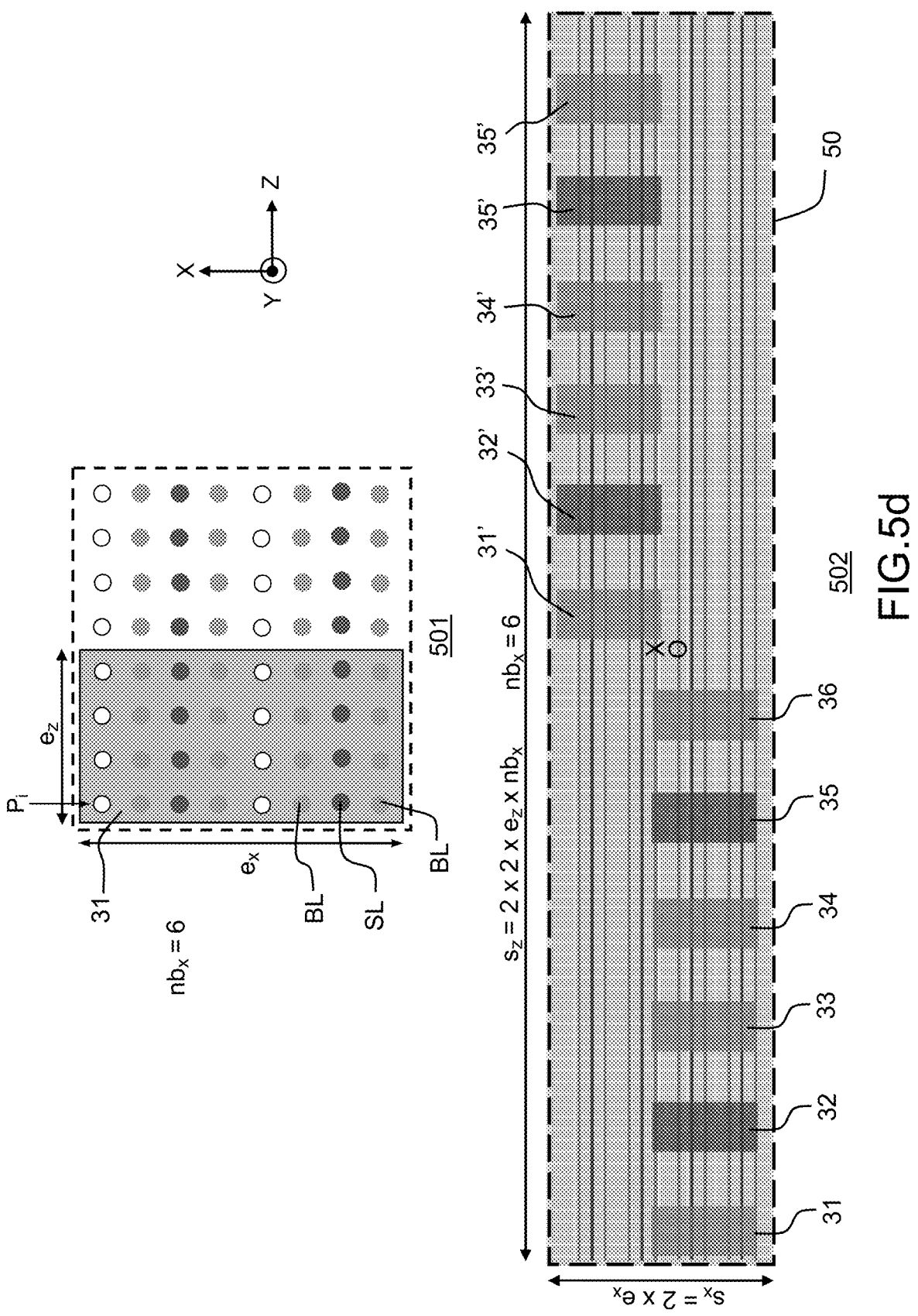
FIG. 5d illustrates a partial top view of the three-dimensional memory structure illustrating dimensioning of a unit pattern of the distribution of the bonding pads according to the invention.

FIG. 5d illustrates a partial top view of the three-dimensional memory structure illustrating dimensioning of a unit pattern 50 of the distribution of the bonding pads according to the invention. Schematic 501 illustrates the dimensions of one bonding pad 31. The example of a rectangular bonding pad will be described, but the described dimensions remain valid for any possible bonding-pad shape. The bonding pad has a first dimension $e_z$ (width) in a first direction Z and a second dimension $e_x$ in a second direction X (length). Along the Z-axis, each pattern partially covers a predetermined number $nb_z$ of successive memory planes $P_1$ to $P_4$, (here $nb_z=4$). Along the X-axis, each pattern covers a predetermined number $nb_x$ (here $nb_x=6$) of connectors (BL,SL) per covered memory plane among $P_1$ to $P_4$.

The optimal dimensions of a unit pattern 50 according to the invention depend on the parameters $e_z$, $e_x$ and $nb_x$. Schematic 501 illustrates the optimal dimensions of a unit pattern 50 according to the invention. The width $s_z$ of the unit pattern 50 in the first direction Z is obtained via the following equation:

$$s_z=2*2*e_z*nb_x$$

The length $s_x$ of the unit pattern 50 in the second direction X is obtained via the following equation:

$$s_x=2*e_x$$

Figure 5E:
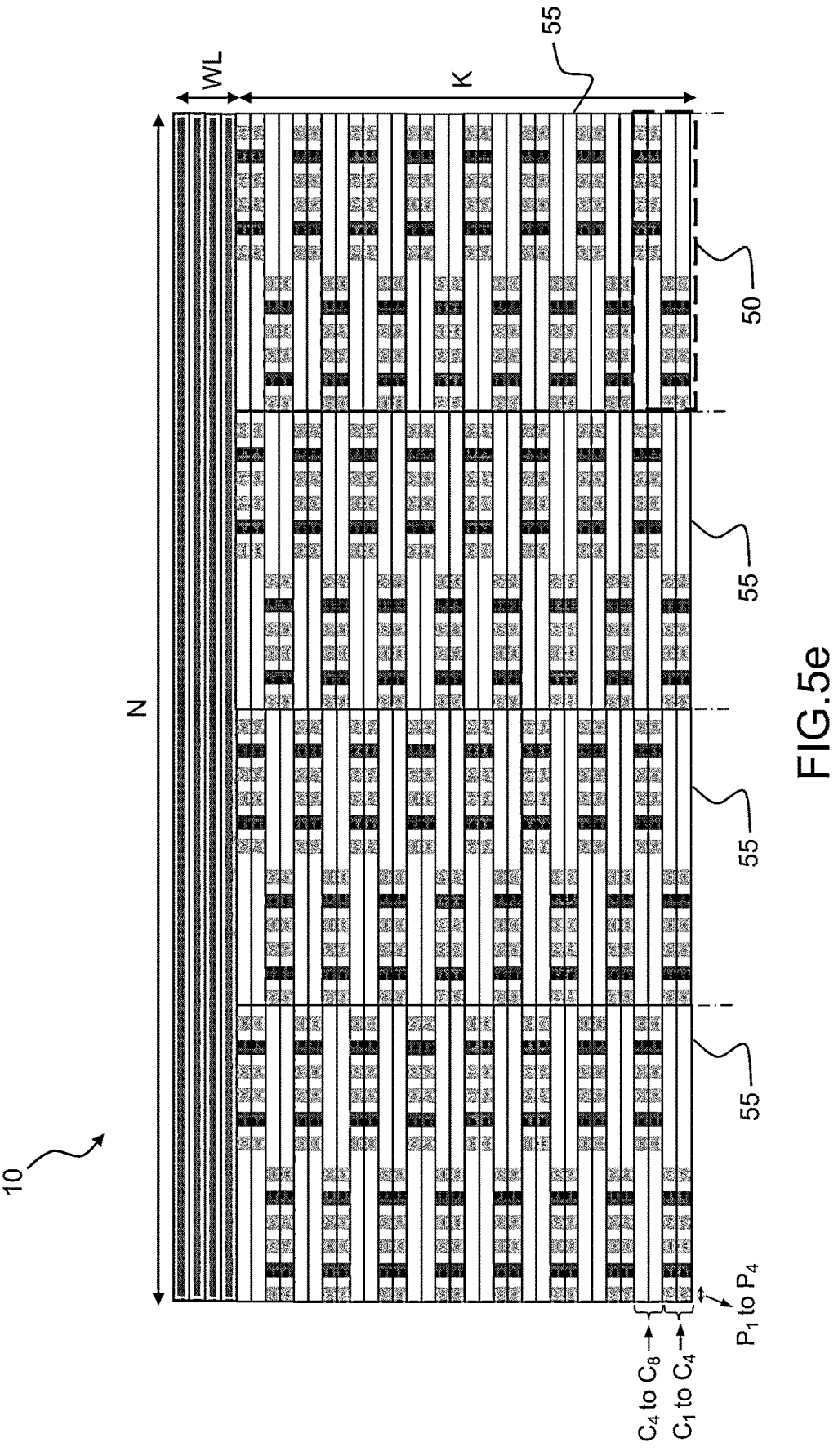
FIG. 5e illustrates a top overview of the three-dimensional memory structure illustrating the second distribution of the bonding pads according to the invention.

FIG. 5e illustrates a top overview of the three-dimensional memory structure illustrating the distribution of the bonding pads according to the second embodiment of the invention.

In order to connect all of the memory cells of the three-dimensional memory structure 10, the unit pattern 50 is repeated so as to cover the entire upper surface of said three-dimensional structure 10. The unit patterns covering given memory planes (these being adjacent along the X-axis) cover a three-dimensional sub-array 55 of memory cells. Adjacent unit patterns 50 covering given columns $C_k$ (these being adjacent along the Z-axis) have separate metal tracks 41 to 46 (and 41' to 46'). For each unit pattern 50, the metal track 41 is not connected to the metal track 41 of an adjacent unit pattern 50, the metal track 42 is not connected to the metal track 42 of an adjacent unit pattern 50 and so on. A plurality of three-dimensional sub-arrays 55 are thus obtained beside one another. Each three-dimensional sub-array 55 is independent of the others in respect of read and write (SET and RESET) operations. This makes it possible to improve the density of the memory structure while increasing the parallelism of the read and write operations (by virtue of the independence of the three-dimensional sub-arrays 55).

Figure 6A:
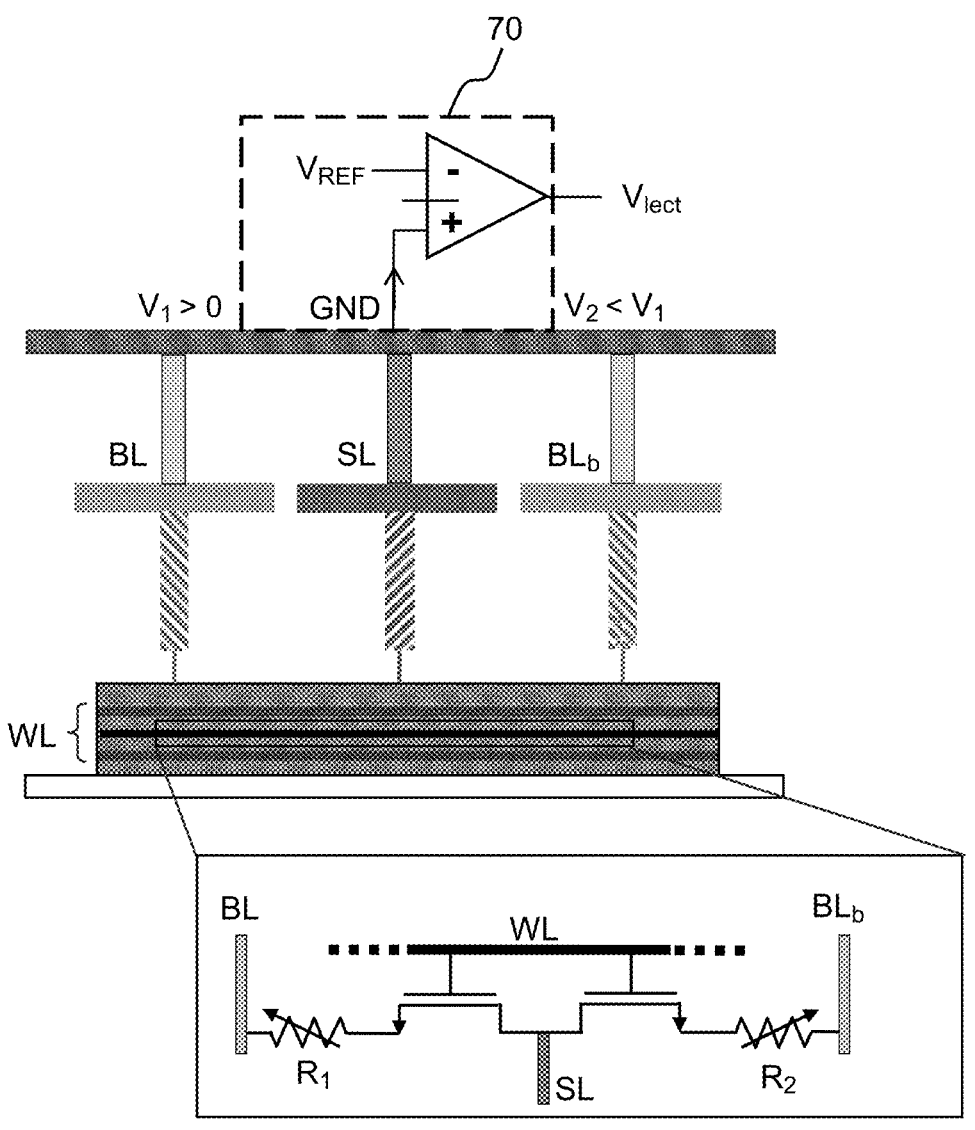
FIG. 6a illustrates a first example of a read circuit compatible with the invention.

FIG. 6a illustrates a first example of a read circuit 70 compatible with the invention. The data storage circuit further comprises, for each column $C_k$ of each memory plane $P_i$, a read circuit 70 produced on the second semiconductor substrate SUB2. Each read circuit 70 comprises a comparator 71 for comparing a read signal delivered by the first input/output node SL of the memory cell to be read to a reference voltage VREF (or a reference current). The read signal is propagated through the interconnection structure 30. In order to read the memory cell CM1, the control circuit 20 (not shown here) is configured to apply a positive voltage $V_1$ to the second input/output node BL, and to keep the first input/output node SL at electrical ground. The adjacent memory cell $CM_2$ shares the first input/output node SL with the memory cell $CM_1$ to be read. The second input/output node $BL_b$ of the memory cell $CM_2$ is kept at electrical ground. This induces a flow of current $I_{SL}$ through the first input/output node SL. The comparator allows the resistive state of the memory cell $CM_1$ to be assessed and therefore the logical datum stored in said memory cell to be read.

Figure 6B:
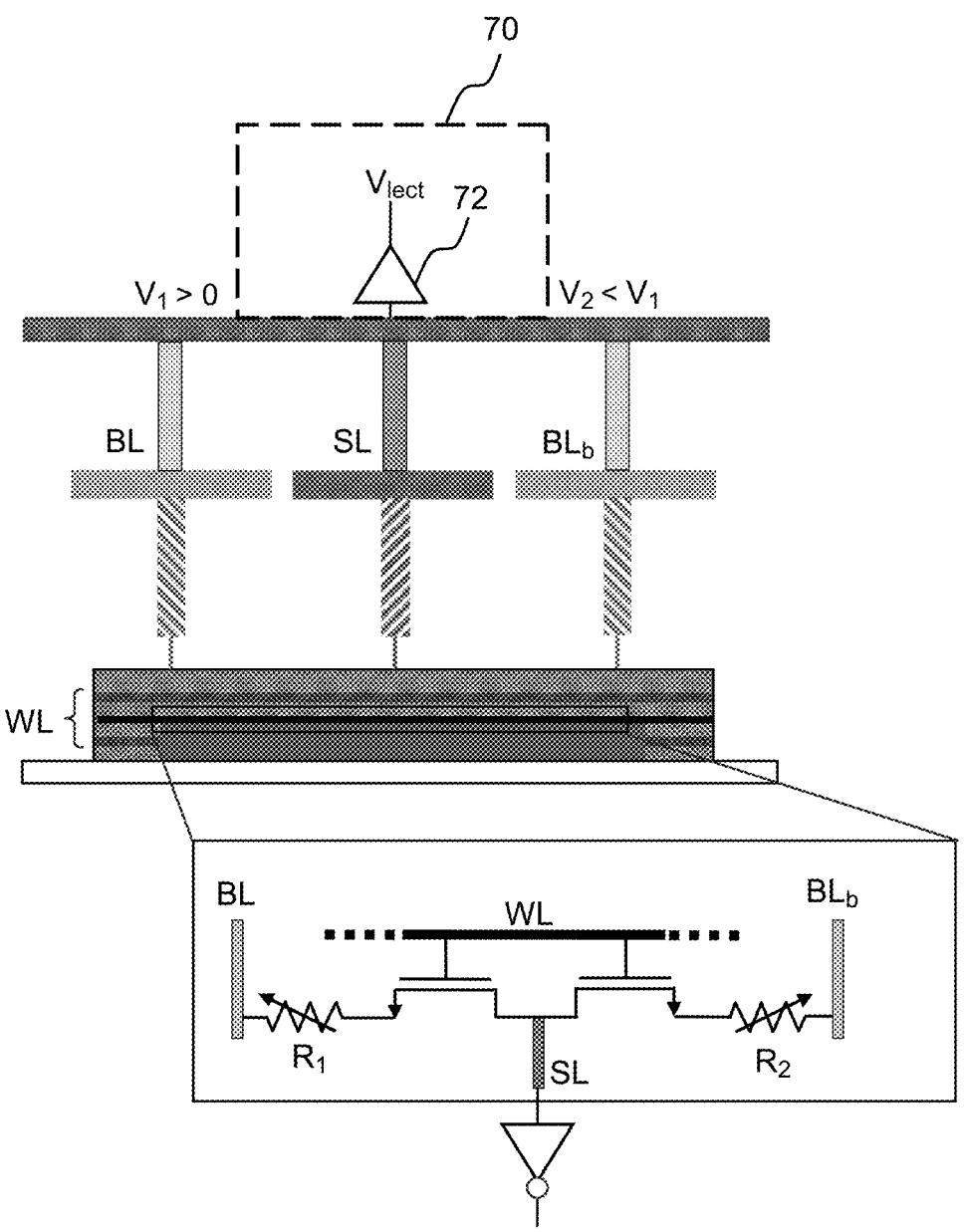
FIG. 6b illustrates a second example of a read circuit compatible with the invention.

Alternatively, FIG. 6*b* illustrates a second example of a read circuit 70 compatible with the invention. The data storage circuit further comprises, for each column $C_k$ of each memory plane $P_i$, a read circuit 70 produced on the second semiconductor substrate SUB2. Each read circuit 70 comprises an inverter 72 connected to the first input/output node SL of the memory cell $CM_1$ to be read. In order to read the memory cell $CM_1$, the control circuit 20 (not shown here) is configured to apply a positive voltage $V_1$ to the second input/output node BL. The adjacent memory cell $CM_2$ shares the first input/output node SL with the memory cell $CM_1$ to be read. The control circuit 20 is configured to apply a positive voltage $V_2$ to the second input/output node $BL_b$ of the memory cell $CM_2$. The voltage $V_2$ is less than the voltage $V_1$. The difference between $V_1$ and $V_2$ is centred on the threshold (or switching) voltage of the inverter. If the memory cell $CM_1$ has a logic datum x=1 stored (low resistive state), the voltage $V_{read}$ output by the inverter 71 will be in the low logic state. If the memory cell $CM_1$ has a logic datum x=0 stored (high resistive state), the voltage $V_{read}$ output by the inverter 71 will be in the high logic state.

This embodiment makes it possible to perform read-out with a less complex read circuit, this making it possible to simplify implementation and increase read-out parallelism.

The invention claimed is:

1. A data storage circuit of NOR type comprising:
a three-dimensional memory structure, produced on a first semiconductor substrate (SUB1), and comprising a plurality of memory planes ($P_i$) of rank i ranging from 1 to N, with N a natural number greater than 1, each plane forming a two-dimensional array of non-volatile, resistive and programmable memory cells, each memory cell having a selection node (WL), a first input/output node (SL) and a second input/output node (BL); said array comprises M rows ($L_j$) of rank j ranging from 1 to M and K columns (Ck) of rank k ranging from 1 to K, with M and K two non-zero natural numbers;
the three-dimensional memory structure (10) having an upper surface (Sur1) comprising a plurality of connectors ($BL_k$, $SL_k$, $BL_{kb}$) distributed over said upper surface;
for each memory plane ($P_i$): the first input/output nodes (SL) of the memory cells belonging to any of said columns ($C_k$) are interconnected to a common connector ($SL_k$) among said plurality of connectors; and the second input/output nodes (BL) of the memory cells belonging to any of said columns ($C_k$) are interconnected to a common connector ($BL_k$, $BL_{kb}$) among said plurality of connectors; so that each connector ($BL_k$, $SL_k$, $BL_{kb}$) of said plurality of connectors is connected to at least one among the first or second input/output nodes (SL, BL) of any of said columns ($C_k$);
a control circuit configured to apply control voltages (VBL, VSL, VWL) to the nodes of each memory cell; and produced on a second semiconductor substrate (SUB2); the control circuit is superposed on said upper surface (Sur1);
an interconnection structure comprising:
a plurality of bonding pads placed between the control circuit and said upper surface (Sur1);

each bonding pad connects the control circuit to a dedicated connector ($BL_k$, $SL_k$, $BL_{kb}$) of said plurality of connectors; each bonding pad is connected to an elementary group of memory cells belonging to separate memory planes ($P_i$), said plurality of bonding pads forming a periodic repetition of a unit pattern in a plane (XZ) parallel to the upper surface (Sur1).

2. The data storage circuit according to claim 1, wherein each bonding pad has a first dimension ($e_z$) in a first direction (Z) and a second dimension (ex) in a second direction (X);
the width ($s_z$) in the first direction (Z) of the unit pattern in the first direction (Z) is equal to the first dimension ($e_z$) multiplied by $4*nb_x$, with $nb_x$ the number of connectors ($BL_k$, $SL_k$, $BL_{kb}$) covered by the area of the bonding pad belonging to a given memory plane ($P_i$) in the second direction (X);
the length ($s_x$) is equal to twice the second dimension ($e_x$) of said bonding pad in the second direction (X).

3. The data storage circuit according to claim 1, wherein the interconnection structure further comprises for each elementary group:
a first connection track for interconnecting the first input/output nodes (BL) of the memory cells (CM) belonging to columns ($C_k$) of given rank k of a plurality of separate memory planes;
a second connection track for interconnecting the second input/output nodes (SL) of the memory cells (CM) belonging to columns ($C_k$) of given rank k of a plurality of separate memory planes.

4. The data storage circuit according to claim 1, further comprising a dielectric layer encapsulating the three-dimensional memory structure and bearing the plurality of bonding pads; and wherein the interconnection structure further comprises a set of through-vias passing through the dielectric layer, each via among the set of vias being intended to connect one bonding pad to one associated connector ($BL_k$, $SL_k$, $BL_{kb}$).

5. The data storage circuit according to claim 1, further comprising at least one read circuit produced on the second semiconductor substrate (SUB2).

6. The data storage circuit according to claim 5, wherein each read circuit comprises an inverter able to carry out a differential read of two memory cells belonging to two adjacent columns and having a common first input/output node (SL) and having two second input/output nodes ($BL_1$, $BL_{1b}$) intended to receive complementary control signals ($VBL_1$, $VBL_{1b}$).

7. The data storage circuit according to claim 1, wherein each memory cell (CM) comprises:
a programmable resistive storage structure having:
an upper electrode (EL1) connected to the second input/output node (BL) of said memory cell (CM); and a lower electrode (EL2);
a selection transistor (T1) having a gate connected to the selection node (WL) of said memory cell and connecting the lower electrode (EL2) to the first input/output node (SL) of said memory cell (CM).

8. The data storage circuit according to claim 7, wherein each column ($C_k$) of memory cells (CM) comprises:
a stack of a plurality of selection transistors (T1) in a first direction ($\Delta$);
each selection transistor being of gate-all-around type and comprising, perpendicular to the first direction ($\Delta$), a conduction channel (CC) made of a semiconductor and having two ends;

the first end of the channel corresponding to the source of the selection transistor and the second corresponding to the drain of the transistor;

in the first direction ($\Delta$), a first metal pillar ($BL_1$) connecting the sources of the various selection transistors;

a second dielectric layer (C'2) parallel to the first direction ($\Delta$) and laterally covering the drains of the selection transistors;

at least one metal layer (C'3) parallel to the first direction and deposited on the dielectric layer;

in the first direction ($\Delta$), a second metal pillar ($BL_{1b}$) making lateral contact with the at least one metal layer;

for each selection transistor, the assembly formed by the source, the dielectric layer (C'2) and the metal layer (C'3) forms an elementary resistive storage structure (S1).

9. The data storage circuit according to claim 1, wherein:

the area of a bonding pad is equal to the area of a region of the upper surface (Sur1) comprising a single connector ($BL_1$, $SL_1$, $BL_{1b}$);

the unit pattern comprises three bonding pads;

the unit pattern covers an elementary group of memory cells belonging to six separate successive memory planes ($P_i$).

10. The data storage circuit according to claim 1, wherein:

the area of a bonding pad is equal to the area of a region of the upper surface (Sur1) comprising at least six connectors ($BL_1$, $SL_1$, $BL_{1b}$, $BL_2$, $SL_2$, $BL_{2b}$);

the unit pattern comprises at least six bonding pads;

the unit pattern covers an elementary group of memory cells belonging to at least 96 separate successive memory planes ($P_i$).

11. The data storage circuit according to claim 1, wherein the unit pattern comprises a first sub-group of bonding pads and a second sub-group of bonding pads, the sub-groups being symmetrical with respect to each other about a central point (O) of the unit pattern.

12. The data storage circuit according to claim 1, wherein the unit pattern covers two groups of an equal number of one or more columns, each group of one or more columns being connected to the same number of bonding pads.

* * * * *